United States Patent
Ren et al.

(10) Patent No.: US 9,401,684 B2
(45) Date of Patent: Jul. 26, 2016

(54) METHODS, SYSTEMS, AND COMPUTER READABLE MEDIA FOR SYNTHESIZING SOUNDS USING ESTIMATED MATERIAL PARAMETERS

(71) Applicant: The University of North Carolina at Chapel Hill, Chapel Hill, NC (US)

(72) Inventors: Zhimin Ren, San Francisco, CA (US); Hengchin Yeh, Chapel Hill, NC (US); Ming Lin, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 14/398,368

(22) PCT Filed: May 31, 2013

(86) PCT No.: PCT/US2013/043643
§ 371 (c)(1),
(2) Date: Oct. 31, 2014

(87) PCT Pub. No.: WO2014/042718
PCT Pub. Date: Mar. 20, 2014

(65) Prior Publication Data
US 2015/0124999 A1 May 7, 2015

Related U.S. Application Data

(60) Provisional application No. 61/653,827, filed on May 31, 2012.

(51) Int. Cl.
*H03G 5/00* (2006.01)
*H03G 3/00* (2006.01)
(Continued)

(52) U.S. Cl.
CPC . *H03G 3/00* (2013.01); *G10H 1/10* (2013.01); *G10H 1/16* (2013.01); *G10H 2250/235* (2013.01); *G10H 2250/435* (2013.01); *G10H 2250/511* (2013.01)

(58) Field of Classification Search
CPC .............. G10H 1/16; G10H 2250/235; G10H 2250/435; G10H 1/10; G10H 2250/511; H03G 3/00
USPC .......................................................... 381/98
See application file for complete search history.

(56) References Cited

U.S. PATENT DOCUMENTS 6,748,355 B1 6/2004 Miner et al.
2005/0119890 A1 6/2005 Hirose
(Continued)

OTHER PUBLICATIONS

Notification of Transmittal of the International Search Report and the Written Opinion of the International Searching Authority, or the Declaration for International Application No. PCT/US2013/043643 (Apr. 22, 2014).

(Continued)

*Primary Examiner* — Paul S Kim
(74) *Attorney, Agent, or Firm* — Jenkins, Wilson, Taylor & Hunt, P.A.

(57) ABSTRACT

The subject matter described herein includes methods, systems, and computer readable media for synthesizing sounds using estimated material parameters. According to one aspect, a method for sound synthesis using estimated material parameters is provided. The method includes at a computing platform including a memory and a processor, estimating, by the processor and based on a recorded audio sample of an impact on a physical object, one or more material parameters of a physical object for use in synthesizing a sound associated with a virtual object having material properties similar to the physical object. The method further includes storing the one or more material parameters in memory. The method further includes using the estimated material parameters to generate a synthesize sound for the virtual object.

30 Claims, 20 Drawing Sheets

(51) Int. Cl.
G10H 1/10 (2006.01)
G10H 1/16 (2006.01)

(56) References Cited

U.S. PATENT DOCUMENTS

2009/0308230 A1 12/2009 Kayama
2010/0010786 A1* 1/2010 Maxwell ............... G10H 5/007
703/2
2012/0039477 A1 2/2012 Schijers et al.

OTHER PUBLICATIONS

Besl, et al., "A Method for Registration of 3-D Shapes." IEEE Transactions on Graphics, pp. 239-256 (1992).
Bonneel, et al., "Fast Modal Sounds with Scalable Frequency-Domain Synthesis," ACM Transactions on Graphics, (TOG) 27, 3, 24 (2008).
Chadwick, et al., "Harmonic Shells: A Practical Nonlinear Sound Model for Near-Rigid Thin Shells," In SIGGRAPH Asia '09: ACM SIGGRAPH Asia 2009 papers, ACM, New York, NY, USA, pp. 1-10, (2009).
Chadwick, et al., "Animating Fire With Sound," In ACM Transactions on Graphics, (TOG) vol. 30, ACM, 84, (2011).
Cook, "Physically Informed Sonic Modeling (PhISM): Percussive Synthesis," In Proceedings of the 1996 International Computer Music Conference. The International Computer Music Association, pp. 228-231, (1996).
Cook, "Physically Informed Sonic Modeling (PhISM): Synthesis of Percussive Sounds," Computer Music Journal 21, 3, pp. 38-49, (1997).
Cook, "Real Sound Synthesis for Interactive Applications," A. K. Peters, Ltd, Natick, MA, USA (2002).
Corbett, et al., "Timbrefields: 3d Interactive Sound Models for Real-Time Audio," Presence: Teleoperators and Virtual Environments 16, 6, pp. 643-654, (2007).
Dobashi, et al., "Real-Time Rendering of Aerodynamic Sound Using Sound Textures Based on Computational Fluid Dynamics," ACM Trans. Graph 22, 3, pp. 732-740 (2003).
Dobashi, et al., "Synthesizing Sound From Turbulent Field Using Sound Textures for Interactive Fluid Simulation," In Computer Graphics Forum, vol. 23, Wiley Online Library, pp. 539-545, (2004).
Dubuisson, et al., "A Modified Hausdorff Distance for Object Matching," In Proceedings of 12th International Conference on Pattern Recognition, vol. 1, IEEE Comput. Soc. Press, pp. 566-568, (1994).
Fontana, "The Sounding Object," Mondo Estremo, (2003).
Gope, et al., "Affine Invariant Comparison of Point-Sets Using Convex Hulls and Hausdorff Distances," Pattern Recognition 40, 1, pp. 309-320, (2003).
Griffin, et al., "Signal Estimation From Modified Short-Time Fourier Transform," Acoustics, Speech and Signal Processing, IEEE Transactions, 32, 2, pp. 236-243. (Apr. 1984).
ISO, "ISO 226: 2003: Acoustics—Normal equal-loudness-level contours," International Organization for Standardization, (2003).
James, et al., "Precomputed Acoustic Transfer: Output-Sensitive, Accurate Sound Generation for Geometrically Complex Vibration Sources," In ACM SIGGRAPH 2006 Papers, ACM, pp. 995, (2006).
Klatzky, et al., "Perception of Material from Contact Sounds," Presence: Teleoper, Virtual Environ, 9, pp. 339-410, (2000).
Krotkov, et al., "Analysis and Synthesis of the Sounds of Impact Based on Shape-Invariant Properties of Materials," In Proceedings of the 1996 International Conference on Pattern Recognition (ICPR '96) vol. 1-vol. 7270. ICPR '96, IEEE Computer Society, Washington, DC, USA (1996).
Lagarias, et al., "Convergence Properties of the Nelder-Mead Simplex Method in Low Dimensions," SIAM Journal and Optimization 9, 1, pp. 112-147, (1998).
Lakatos, et al., "The Representation of Auditory Source Characteristics: Simple Geometric Form," Attention, Perception, & Psychophysics 59, 8, pp. 1180-1190, (1997).

Levine, et al., "Multiresolution Sinusoidal Modeling for Wideband Audio with Modifications," In Acoustics, Speech and Signal Processing, 1998. Proceedings of the 1998 IEEE International Conference on. vol. 6 IEEE pp. 3585-3588, (1998).
Lloyd, et al., "Sound Synthesis for Impact Sounds in Video Games," In Proceedings of Symposium on Interactive 3D Graphics and Games, (2011).
Morchen, et al., "Modeling Timbre Distance with Temporal Statistics from Polyphonic Music," Audio, Speech, and Language Processing, IEEE Transactions on 14, 1, pp. 81-90 (2005).
Moss, et al., "Sounding Liquids: Automatic Sound Synthesis from Fluid Simulation," AMC Transactions on Graphics (TOG) (2010).
O'Brien, et al., "Synthesizing Sounds From Physically Based Motion," In Proceedings of ACM SIGGRAPH 2001, ACM Press, pp. 529-536, (2001).
O'Brien, et al, "Synthesizing Sounds From Rigid-Body Simulations," In The ACM SIGGRAPH 2002 Symposium on Computer Animation, ACM Press, pp. 175-181. (2002).
Oppenheim, et al., "Discrete-time Signal Processing," vol. 1999, Prentice Hall Englewood Cliffs, NJ: (1989).
Pai, et al., "Scanning Physical Interaction Behavior of 3D Objects," In Proceedings of the 38th Annual Conference on Computer Graphics and Interactive Techniques, SIGGRAPH '01, ACM, New York, NY, USA, pp. 87-96, (2001).
Pampalk, et al., "Content-Based Organization and Visualization of Music Archives," In Proceedings of the Tenth ACM International Conference on Multimedia, ACM pp. 570-579, (2002).
Picard, et al., "Retargetting Example Sounds to Interactive Physics-Driven Animations," In AES 35th International Conference-Audio for Games, London UK, (2009).
Quatueri, et al., "Speech Transformations Based on a Sinusoidal Representation," In Acoustics, Speech, and Signal Processing, IEEE International Conference on ICASSP '85. vol. 10, pp. 489-492, (1985).
Raghuvanshi, et al., "Symphony: Real-Time Physically Based Sound Synthesis," In Proceedings of Symposium on Interactive 3D Graphics and Games, (2006).
Ren et al., "Tabletop Ensemble: Touch-Enabled Virtual Percussion Instruments," Association for Computing Machinery, Inc., pp. 1-8 (Mar. 9-11, 2012).
Ren, et al., "Synthesizing Contract Sounds Between Textured Models," In Virtual Reality Conference (VR), IEEE, pp. 139-146, (2010).
Roads, "Microsound," The MIT Press, (2004).
Serra, "A System for Sound Analysis/Transformation/Synthesis Based on a Deterministic Plus Stochastic Decomposition," Ph.D Thesis, (1989).
Serra, "Musical Sound Modeling with Sinusoids Plus Noise," Musical Signal Processing, pp. 497-510, (1997).
Serra, et al., "Spectral Modeling Synthesis: A Sound Analysis/Synthesis System Based On A Deterministic Plus Stochastic Decomposition," Computer Music Journal, vol. 14, No. 4, pp. 12-24, (1990).
Shabana, "Vibration of Discrete and Continuous Systems," Springer Verlag, (1997).
Steiglitz, et al., "A Technique for the Identification of Linear Systems," Automatic Control, IEEE Transactions on 10, 4, pp. 461-464, (1965).
Trebien, et al., "Realistic Real-Time Sound Resynthesis and Processing Forinteractive Virtual Worlds," The Visual Computer 25, pp. 469-477, (2009).
Välimäki, et al., "Development and Calibration of a Guitar Synthesizer," Preprints-Audio Engineering Society, (1997).
Välimäki et al., "Physical Modeling Of Plucked String Instruments With Application To Real-Time Sound Synthesis," Journal of Audio Engineering Society, vol. 44, No. 5, pp. 331-353 (1997).
Van Den Doel, et al, "FoleyAutomatic: Physically-Based Sound Effects for Interactive Simulation and Animation," In Proceedings of the 28th Annual Conference on Computer Graphics and Interactive Techniques, ACM New York, NY USA pp. 537-544, (2001).
Van Den Doel, et al., "Interactive Simulation Of Complex Audiovisual Scenes," Presence: Teleoper, Virtual Environ, vol. 13, pp. 99-111, (2004).
Van Den Doel, et al., "The Sounds of Physical Shapes," Presence: Teleoper, Virtual Environ, 7, pp. 382-395, (1998).

(56) References Cited

OTHER PUBLICATIONS

Van Den Doel, et al., "Measurements of Perceptual Quality of Contact Sound Models," In Proceedings of the International Conference on Auditory Display, (ICAD 2002.) pp. 345-349, (2002).
Wang et al., "An Objective Measure for Predicting Subjective Quality of Speech Coders," IEEE Journal on Selected Areas in Communications 10, 5 (Jun.), pp. 819-829, (1992).
Zheng, et al., "Harmonic Fluids," In SIGGRAPH '09: ACM SIGGRAPH 2009 papers, ACM, New York, NY, USA, pp. 1-12, (2010).
Zheng, et al., "Toward High-Quality Modal Contact Sound," ACM Transactions on Graphics (Proceedings of SIGGRAPH 2011) 30, 4 (Aug.), (2011).
Zheng, et al., "Rigid-Body Fracture Sound With Precomputed Soundbanks," ACM Trans, Graph, 29, pp. 69:1-69:13, (2010).
Zwicker, et al., "Psychoacoustics: Facts and Models," 2nd Updated Edition Ed vol. 254, Springer New York, (2007).

\* cited by examiner

METHODS, SYSTEMS, AND COMPUTER READABLE MEDIA FOR SYNTHESIZING SOUNDS USING ESTIMATED MATERIAL PARAMETERS

PRIORITY CLAIM

This application claims the benefit of U.S. Provisional Patent Application Ser. No. 61/653,827, filed May 31, 2012, the disclosure of which is incorporated herein by reference in its entirety.

GOVERNMENT INTEREST

This invention was made with government support under Grant No. U.S. Pat. No. 0,917,040 awarded by the National Science Foundation and Grant No. W911 NF-06-1-0355 awarded by the Army Research Office. The government has certain rights in the invention.

TECHNICAL FIELD

The subject matter described herein relates to sound synthesis. More particularly, the subject matter described herein relates to synthesizing sounds using estimated material parameters.

BACKGROUND

Linear modal synthesis methods have been used to generate sounds for rigid bodies. One of the key challenges in widely adopting such techniques is the lack of automatic determination of satisfactory material parameters that recreate realistic audio quality of sounding' materials. Accordingly, there exists a long felt need for methods, systems, and computer readable media for synthesizing sounds using estimated material parameters.

SUMMARY

The subject matter described herein includes methods, systems, and, computer readable media for synthesizing sounds using estimated material parameters. According to one aspect, a method for sound synthesis using estimated material parameters is provided. The method includes at a computing platform including a memory and a processor, estimating, by the processor and based on a recorded audio sample of an impact on a physical object, one or more material parameters of a physical object for use in synthesizing a sound associated with a virtual object having material properties similar to the physical object. The method further includes storing the one or more material parameters in memory. The method further includes using the estimated material parameters to generate a synthesize sound for the virtual object.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which:

In FIG. 2(a), the system receives an audio clip as input, then features are extracted. Features are then used to search for optimal material parameters based on a perceptually inspired metric. A residual between the recorded audio and the motor synthesis sound is calculated. At run time, the excitation is observed for the modes. Corresponding rigid body sounds that have a similar audio quality as the original sounding materials can be automatically synthesized. A modified residual is added to create a more realistic final sound;

In FIG. 4, Graph (a) shows the relationship between critical band rate (in Bark) and frequency (in hertz). Graph (b) shows the relationship between loudness level $L_N$ (in phon), loudness L (in sone), and the sound pressure level $L_p$ (in decibels). Each curve is an equal loudness contour, where a constant loudness is perceived for pure steady tones with various frequencies;

In FIG. 6, graph (a) illustrates damping versus frequency, (f,d) space. Graph (b) illustrates the points matching problem in the feature domain in the transformed x,y space where x equals X(f) and y equals Y(d). The crosses and circles are the referenced and estimated feature points. The three features having the largest energies are labeled 1, 2, and 3;

DETAILED DESCRIPTION

Figure 1:
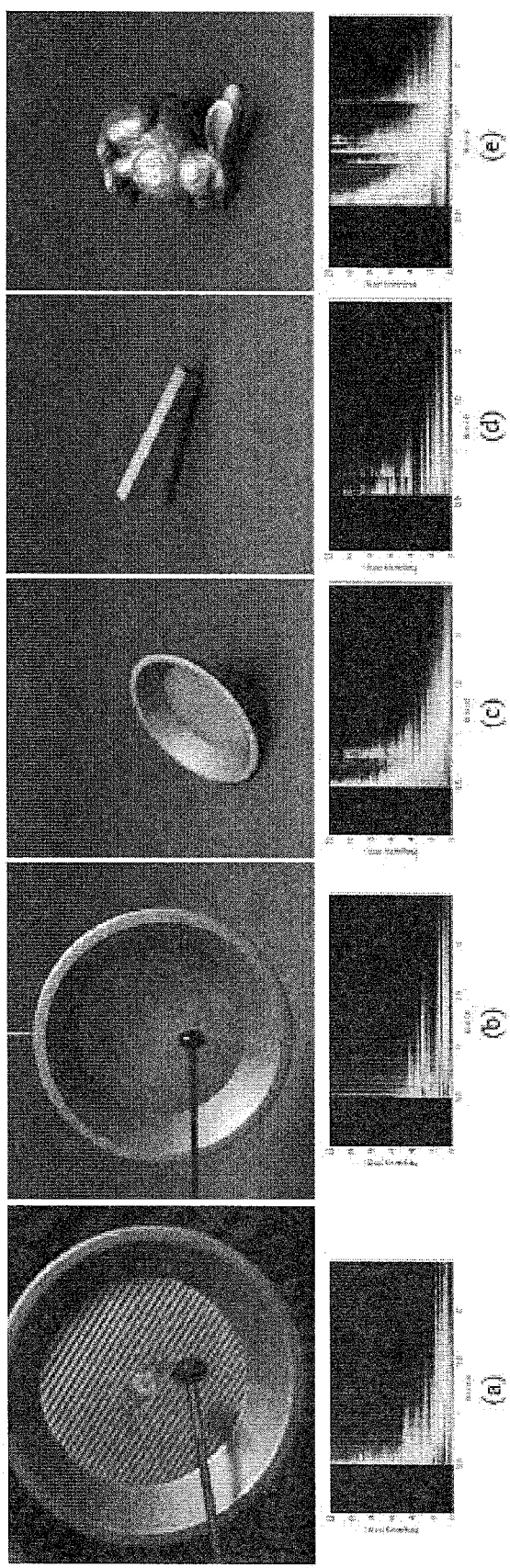
FIG. 1 illustrates real world objects and corresponding recorded sounds. From the recording of a real world object (a), the framework described herein is able to find material parameters and generate similar sound for a replicated object (b). The same set of parameters can be transferred to various virtual objects to produce sounds with the same material quality (c), (d), and (e)

The subject matter described herein includes a method that uses pre-recorded audio clips to estimate material parameters that capture the inherent quality of recorded sounding materials. The method extracts perceptually salient features from audio examples. Based on psychoacoustic principles, we design a parameter estimation algorithm using an optimization framework and these salient features to guide the search of the best material parameters for modal synthesis. We also present a method that compensates for the differences between the real-world recording and sound synthesized using solely linear modal synthesis models to create the final synthesized audio. The resulting audio generated from this sound synthesis pipeline well preserves the same sense of material as a recorded audio example. Moreover, both the estimated material parameters and the residual compensation naturally transfer to virtual objects of different sizes and shapes, while the synthesized sounds vary accordingly. A perceptual study shows the results of this system compares well with real-world recordings in terms of material perception.

1. Introduction

Sound plays a prominent role in a virtual environment. Recent progress has been made on sound synthesis models that automatically produce sounds for various types of objects and phenomena. However, it remains a demanding task to add high-quality sounds to a visual simulation that attempts to depict its real-world counterpart. Firstly, there is the difficulty for digitally synthesized sounds to emulate real sounds as closely as possible. Lack of true-to-life sound effects would cause a visual representation to lose its believability. Secondly, sound should be closely synchronized with the graphical rendering in order to contribute to creation of a compelling virtual world. Noticeable disparity between the dynamic audio and visual components could lead to a poor virtual experience for users.

The traditional sound effect production for video games, animation, and movies is a laborious practice. Talented Foley artists are normally employed to record a large number of sound samples in advance and manually edit and synchronize the recorded sounds to a visual scene. This approach generally achieves satisfactory results. However, it is labor-intensive and cannot be applied to all interactive applications. It is still challenging, if not infeasible, to produce sound effects that precisely capture complex interactions that cannot be predicted in advance.

On the other hand, modal synthesis methods are often used for simulating sounds in real-time applications. This approach generally does not depend on any pre-recorded audio samples to produce sounds triggered by all types of interactions, so it does not require manually synchronizing the audio and visual events. The produced sounds are capable of reflecting the rich variations of interactions and also the geometry of the sounding objects. Although this approach is not as demanding during run time, setting up good initial parameters for the virtual sounding materials in modal analysis is a time-consuming and non-intuitive process. When faced with a complicated scene consisting of many different sounding materials, the parameter selection procedure can quickly become prohibitively expensive and tedious.

Although tables of material parameters for stiffness and mass density are widely available, directly looking up these parameters in physics handbooks does not offer as intuitive, direct control as using a recorded audio example. In fact, sound designers often record their own audio to obtain the desired sound effects. The subject matter described herein includes a new data-driven sound synthesis technique that preserves the realism and quality of audio recordings, while exploiting all the advantages of physically-based modal synthesis. We introduce a computational framework that takes a single example audio recording and estimates the intrinsic material parameters (such as stiffness, damping coefficients, and mass density) that can be directly used in modal analysis. However, as described below in the Conclusions and Future Work section, using multiple audio recordings is also within the scope of the subject matter described herein.

As a result, for objects with different geometries and run-time interactions, different sets of modes are generated or excited differently, and different sounds are produced. However, if the material properties are the same, they should all sound like coming from the same material. For example, a plastic plate being hit, a plastic ball being dropped, and a plastic box sliding on the floor generate different sounds, but they all sound like 'plastic', as they have the same material properties. Therefore, if we can deduce the material properties from a recorded sound and transfer them to different objects with rich interactions, the intrinsic quality of the original sounding material is preserved. Our method can also compensate the differences between the example audio and the modal-synthesized sound. Both the material parameters and the residual compensation are capable of being transferred to virtual objects of varying sizes and shapes and capture all forms of interactions. FIG. 1 shows an example of our framework. From one recorded impact sound (a), we estimated material parameters, which can be directly applied to various geometries (c), (d), and (e) to generate audio effects that automatically reflect the shape variation while still preserve the same sense of material.

Figure 2A:
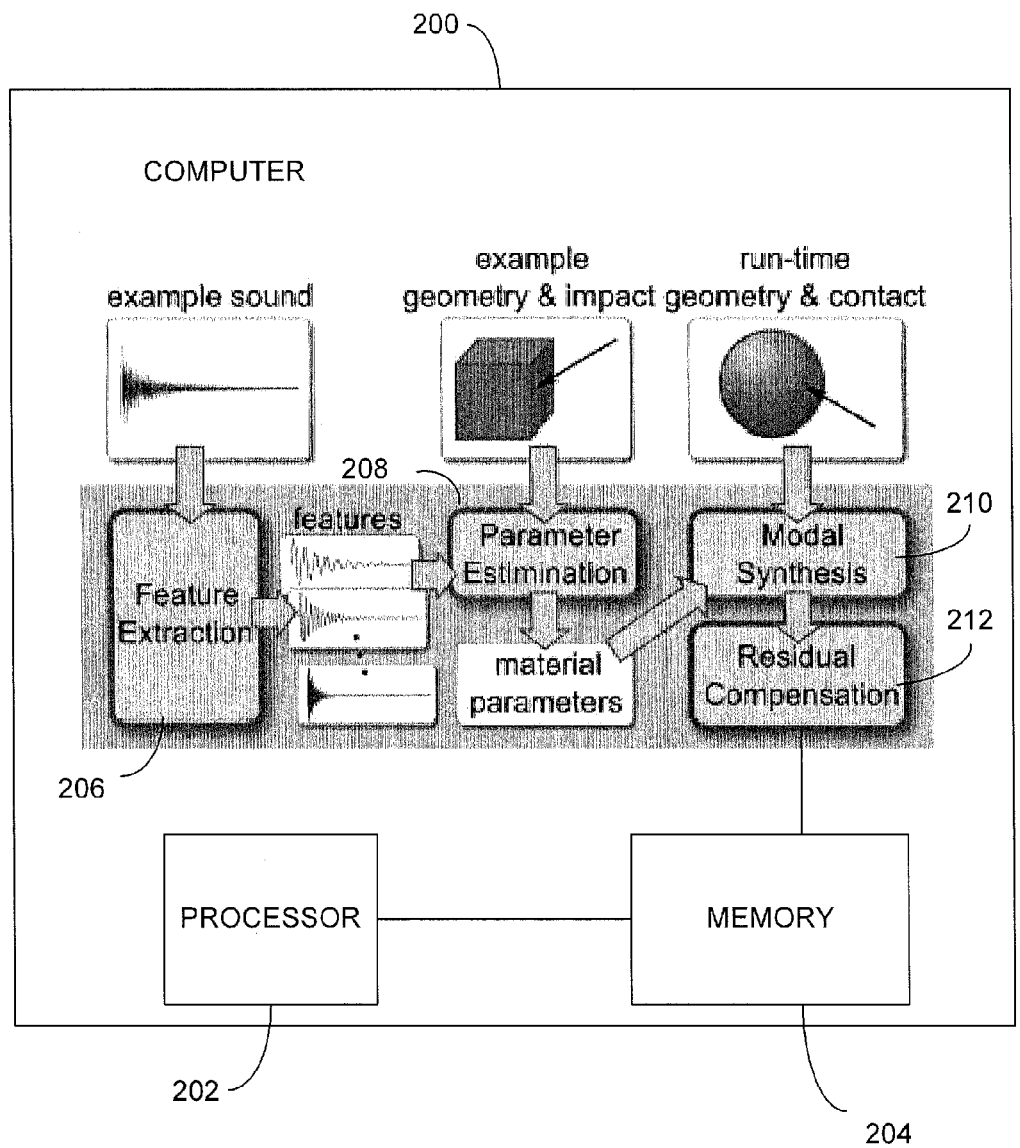
FIG. 2(a) is a block diagram of an exemplary architecture for sound synthesis using estimated material parameters according to an embodiment of the subject matter described herein.

FIG. 2(a) depicts the pipeline of our approach, and its various stages are explained below. Each of the modules in the pipeline illustrated in FIG. 2(a) may be executed on a computer 200 having a processor 202 and a memory 204.

Feature extraction module 206 may reside in memory 204 and be executed by processor 202 to perform feature extraction: Feature extraction may include, given a recorded impact audio clip, initial extraction from the audio o clip of high-level features, namely, a set of damped sinusoids with constant frequencies, dampings, and initial amplitudes (Sec. 4). These features are then used to facilitate estimation of the material parameters (Sec. 5), and guide the residual compensation process (Sec. 6).

Parameter estimation module 208 may reside in memory 204 and be executed by processor 202 to perform parameter estimation: In one example of parameter estimation, due to the constraints of the sound synthesis model, we assume a limited input from just one recording and it is challenging to estimate the material parameters from one audio sample. To do so, a virtual object of the same size and shape as the real-world object used in recording the example audio is created.

Each time an estimated set of parameters is applied to the virtual object for a given impact, the generated sound, as well as the feature information of the resonance modes, are compared with the real world example sound and extracted features respectively using a difference metric. This metric is designed based on psychoacoustic principles, and aimed at measuring both the audio material re-semblance of two objects and the perceptual similarity between two sound clips. The optimal set of material parameters is thereby determined by minimizing this perceptually-inspired metric function (see Sec. 5). These parameters are readily transferable to other virtual objects of various geometries undergoing rich interactions, and the synthesized sounds preserve the intrinsic quality of the original sounding material.

Residual compensation module 210 may reside in memory 204 and be executed by processor 202 to perform residual compensation. Residual compensation accounts for the residual, i.e. the approximated differences between the real-world audio recording and the modal synthesis sound with the estimated parameters. First, the residual is computed using the extracted features, the example recording, and the synthesized audio. Then at run-time, the residual is transferred to various virtual objects. The transfer of residual is guided by the transfer of modes, and naturally reflects the geometry and run-time interaction variation (see Sec. 6).

Figure 2B:
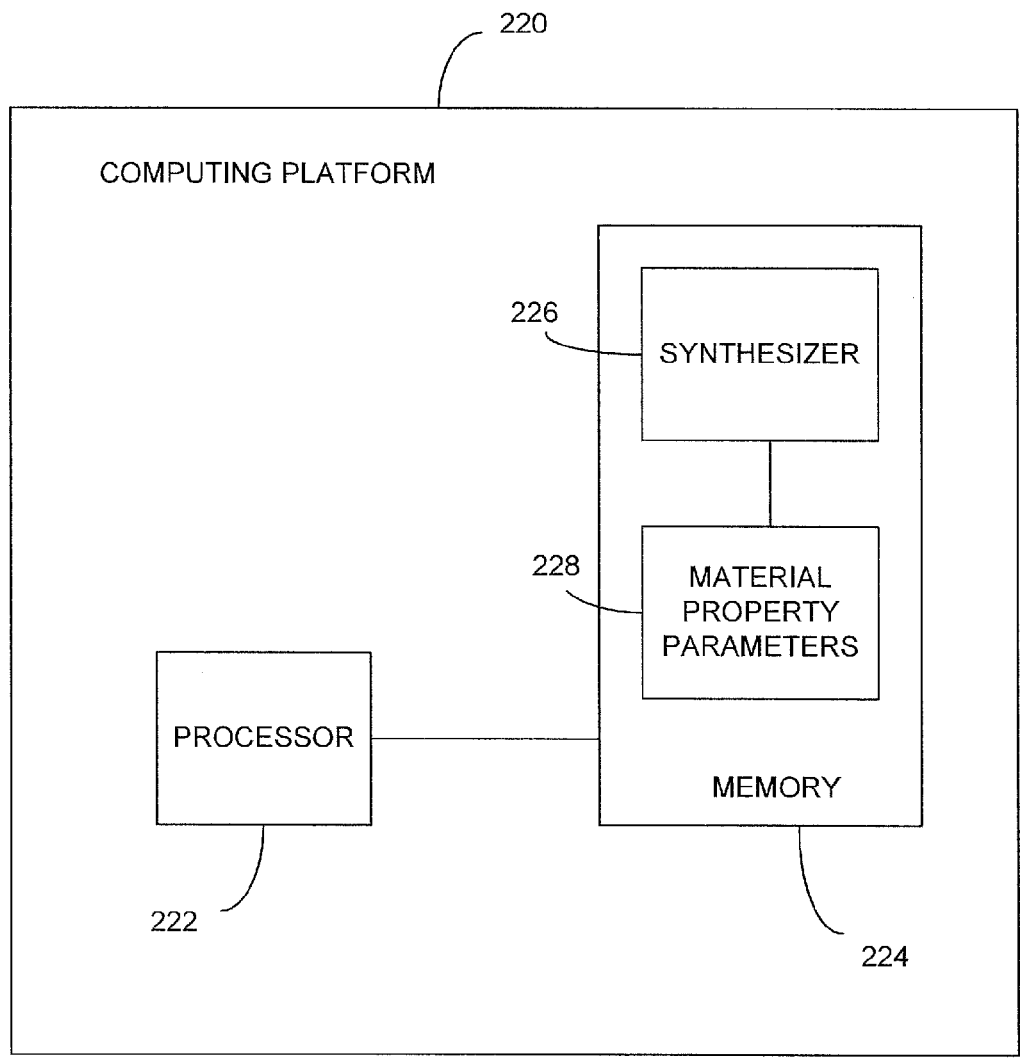
FIG. 2(b) is a block diagram of a system for synthesizing sounds using pre-stored estimated material parameters according to an embodiment of the subject matter described herein.

Once material parameters are estimated for a real world object using the system illustrated in FIG. 2(a), the parameters may be stored in a memory and accessed by a sound synthesizer module to synthesize sounds for virtual objects having the same or similar properties as the real world object. For example, as illustrated in FIG. 2(b), a computer 220 may include a processor 222 and a memory 224. Computer 220 may be a personal computer, a laptop computer, a tablet computer, a mobile device, a gaming console, a graphics card or any other platform with a processor and on which it is desirable to generate synthesized sounds for virtual objects. A synthesizer module 226 may be embodied or stored in memory 224. Memory 224 may also store material parameters 228 estimated based on a recorded audio sample of an impact on a physical object having material properties similar to a virtual object (see Sec. 5). For example, the virtual object may be an object in a game, such as a car door, the recorded sound may be the sound of the door closing, and the material properties may include properties of the door. Synthesizer module 226 may be configured to retrieve one or more of the estimated material parameters 228 associated with a virtual object and utilize the retrieved material parameters to synthesize a sound associated with the virtual object. For example, synthesizer module 226 may synthesize the sound of a virtual car door closing where the virtual card door is larger than the real car door for which the material properties were calculated and stored using the estimated material parameters stored for the real car door.

According to another aspect of the subject matter described herein, synthesizer module 226 may be configured to augment the sound to account for residual differences between the set of damped sinusoids and the recorded audio sample, as described below in Sec. 6. Synthesizer module 226 may also be configured to determine the residual differences between the set of damped sinusoids and the recorded audio sample by computing a represented sound that corresponds to a portion of the recorded audio sample represented by the set of damped sinusoids and subtracting a power spectrogram of the represented sound from a power spectrogram of the recorded audio sample, as also described below in Sec. 6. When the virtual object differs in geometry from the real object for which the audio was recorded, synthesizer module 226 may be configured to generate a transform function for transforming a power spectrogram based on the set of damped sinusoids to a power spectrogram that accounts for the differing geometry and apply the transform function to a power spectrogram of the residual differences, as described below in Sec. 6.

Exemplary contributions of the present subject matter are summarized below:

a feature-guided parameter estimation framework to determine the optimal material parameters that can be used in existing modal sound synthesis applications;

an effective residual compensation method that accounts for the difference between the real-world recording and the modal-synthesized sound;

a general framework for synthesizing rigid-body sounds that closely resemble recorded example materials; and automatic transfer of material parameters and residual compensation to different geometries and runtime dynamics, producing realistic sounds that vary accordingly.

2. Related Work

In the last couple of decades, there has been strong interest in digital sound synthesis in both computer music and computer graphics communities due to the needs for auditory display in virtual environment applications. The traditional practice of Foley sounds is still widely adopted by sound designers for applications like video games and movies. Real sound effects are recorded and edited to match a visual display. More recently, granular synthesis became a popular technique to create sounds with computers or other digital synthesizers. Short grains of sounds are manipulated to form a sequence of audio signals that sound like a particular object or event. Roads [2004] gave an excellent review on the theories and implementation of generating sounds with this approach. Picard et al. [2009] proposed techniques to mix sound grains according to events in a physics engine.

Physically-Based Sound Synthesis: Another approach for simulating sound sources is using physically-based simulation to synthesize realistic sounds that automatically synchronize with the visual rendering. Generating sounds of interesting natural phenomena like fluid dynamics and aerodynamics have been pro-posed [Dobashi et al. 2003; 2004; Zheng and James 2009; Moss et al. 2010; Chadwick and James 2011]. The ubiquitous rigid-body sounds play a vital role in all types of virtual environments, and the synthesis of rigid body sounds using estimated material properties is described in detail herein. O'Brien et al. [2001] proposed simulating rigid bodies with deformable body models that approximates solid objects' small-scale vibration leading to variation in air pressure, which propagates sounds to human ears. This approach accurately captures surface vibration and wave propagation once sounds are emitted from objects. However, it is far from being efficient enough to handle interactive applications. Adrien [1991] introduced modal synthesis to digital sound generation. For real-time applications, linear modal sound synthesis has been widely adopted to synthesize rigid-body sounds [van den Doel and Pai 1998; O'Brien et al. 2002; Raghuvanshi and Lin 2006; James et al. 2006; Zheng and James 2010]. This method acquires a modal model (i.e. a bank of damped sinusoidal waves) using modal analysis and generates sounds at runtime based on excitation to this modal model. Moreover, sounds of complex interaction can be achieved with modal synthesis. Van den Doel et al. [2001] presented parametric models to approximate contact forces as ex-citation to modal models to generate impact, sliding, and rolling sounds. Ren et al. [2010] proposed including normal map information to simulate sliding sounds that reflect contact surface de-tails. More recently, Zheng and James [2011] created highly realistic contact sounds with linear modal synthesis by enabling non-rigid sound phenomena and modeling vibrational contact damping. Moreover, the standard modal synthesis can be accelerated with techniques proposed by [Raghuvanshi and Lin 2006; Bonneel et al. 2008], which make synthesizing a large number of sounding objects feasible at interactive rates.

The use of linear modal synthesis is not limited to creating simple rigid-body sounds. Chadwick et al. [2009] used modal analysis to compute linear mode basis, and added nonlinear coupling of those modes to efficiently approximate the rich thin-shell sounds. Zheng and James [2010] extended linear modal synthesis to handle complex fracture phenomena by precomputing modal models for ellipsoidal sound proxies.

However, few previous sound synthesis works addressed the issue of how to determine material parameters used in modal analysis to more easily recreate realistic sounds.

Parameter Acquisition: Spring-mass [Raghuvanshi and Lin 20061 and finite element [O'Brien et al. 2002] representations have been used to calculate the modal model of arbitrary shapes. Challenges lie in how to choose the material parameters used in these representations. Pai et al. [2001] and Corbett et al. [2007] directly acquires a modal model by estimating modal parameters (i.e. amplitudes, frequencies, and dampings) from measured impact sound data. A robotic device is used to apply impulses on a real object at a large number of sample points, and the resulting impact sounds are analyzed for modal parameter estimation. This method is capable of constructing a virtual sounding object that accurately recreates the audible resonance of its measured real-world counterpart. However, each new virtual geometry would require a new measuring process performed on a real object that has exactly the same shape, and it can become prohibitively expensive with an increasing number of objects in a scene. This approach generally extracts hundreds of parameters for one object from many audio clips, while the goal of our technique instead is to estimate the few parameters that best represent one material of a sounding object from only one audio clip.

To the best of our knowledge, the only other research work that attempts to estimate sound parameters from one recorded clip is by Lloyd et al. [2011]. Pre-recorded real-world impact sounds are utilized to find peak and long-standing resonance frequencies, and the amplitude envelopes are then tracked for those frequencies. They proposed using the tracked time-varying envelope as the amplitude for the modal model, instead of the standard damped sinusoidal waves in conventional modal synthesis. Richer and more realistic audio is produced this way. Their data-driven approach estimates the modal parameters instead of material parameters. Similar to the method proposed by Pai et al. [2001], these are per-mode parameters and not transferable to another object with corresponding variation. At runtime, they randomize the gains of all tracked modes to generate an illusion of variation when hitting different locations on the object. Therefore, the produced sounds do not necessarily vary correctly or consistently with hit points. Their adopted resonance modes plus residual resynthesis model is very similar to that of SoundSeed Impact [Audiokinetic 2011], which is a sound synthesis tool widely used in the game industry. Both of these works extract and track resonance modes and modify them with signal processing techniques during synthesis. None of them attempts to fit the extracted per-mode data to a modal sound synthesis model, i.e. estimating the higher-level material parameters.

In computer music and acoustic communities, researchers proposed methods to calibrate physically-based virtual musical instruments. For example, Välimäki et al. [1996; 1997] proposed a physical model for simulating plucked string instruments. They presented a parameter calibration framework that detects pitches and damping rates from recorded instrument sounds with signal processing techniques. However, their framework only fits parameters for strings and resonance bodies in guitars, and it cannot be easily extended to extract parameters of a general rigid-body sound synthesis model. Trebian and Oliveira [2009] presented a sound synthesis method with linear digital filters. They estimated the parameters for recursive filters based on pre-recorded audio and re-synthesized sounds in real time with digital audio processing techniques. This approach is not designed to capture rich physical phenomena that are automatically coupled with varying object interactions. The relationship between the perception of sounding objects and their sizes, shapes, and material properties have been investigated with experiments, among which Lakatos et al. [1997] and Fontana [2003] presented results and studied human's capability to tell materials, sizes, and shapes of objects based on their sounds.

Modal Plus Residual Models: The sound synthesis model with a deterministic signal plus a stochastic residual was introduced to spectral synthesis by Serra and Smith [1990]. This approach analyzes an input audio and divides it into a deterministic part, which are time-variant sinusoids, and a stochastic part, which is obtained by spectral subtraction of the deterministic sinusoids from the original audio. In the resynthesis process, both parts can be modified to create various sound effects as suggested by Cook [1996; 1997; 2002] and Lloyd et al. [2011]. Methods for tracking the amplitudes of the sinusoids in audio dates back to Quateri and McAulay [1985], while more recent work [Serra and Smith III 1990; Serra 1997; Lloyd et al. 2011] also proposes effective methods for this purpose. All of these works directly construct the modal sounds with the extracted features, while our modal component is synthesized with the estimated material parameters. Therefore, although we adopt the same concept of modal plus residual synthesis for our framework, we face different constraints due to the new objective in material parameter estimation, and render these existing works not applicable to the problem addressed herein. Later, we will describe our feature extraction (Sec. 4) and residual compensation (Sec. 6) methods that are suitable for material parameter estimation.

3. Background

Modal Sound Synthesis: The standard linear modal synthesis technique [Shabana 1997] is frequently used for modeling of dynamic deformation and physically-based sound synthesis. We adopt tetrahedral finite element models to represent any given geometry [O'Brien et al. 2002]. The displacements, $x \in R^{3N}$, in such a system can be calculated with the following linear deformation equation:

$$M\ddot{x} + C\dot{x} + Kx = f \quad (1)$$

where M, C, and K respectively represent the mass, damping and stiffness matrices. For small levels of damping, it is reasonable to approximate the damping matrix with Rayleigh damping, i.e. representing damping matrix as a linear combination of mass matrix and stiffness matrix: $C = \alpha M + \beta K$. This is a well-established practice and has been adopted by many modal synthesis related works in both graphics and acoustics communities. After solving the generalized eigenvalue problem $$KU = \Lambda MU \quad (2)$$

the system can be decoupled into the following form:

$$\ddot{q} + (\alpha I + \beta \Lambda)\dot{q} + \Lambda q = U^T f \quad (3)$$

where $\Lambda$ is a diagonal matrix, containing the eigenvalues of Eqn. 2; U is the eigenvector matrix, and transforms x to the decoupled deformation bases q with x=Uq.

The solution to this decoupled system, Eqn. 3, is a bank of modes, i.e. damped sinusoidal waves. The i'th mode looks like:

$$q_i = a_i e^{-d_i t} \sin(2\pi f_i t + \theta_i) \quad (4)$$

where $f_i$ is the frequency of the mode, $d_i$ is the damping coefficient, $a_i$ is the excited amplitude, and $\theta_i$ is the initial phase.

The frequency, damping, and amplitude together define the feature of $\phi$ mode i:

$$\phi_i = (f_i, d_i, a_i) \quad (5)$$

and will be used throughout the rest of this description. We ignore $\theta_i$ in Eqn. 4 because it can be safely assumed as zero in our estimation process, where the object is initially at rest and struck at t=0. $f$ and $\omega$ are used interchangeably to represent frequency, where $\omega = 2\pi f$.

Material properties: The values in Eqn. 4 depend on the material properties, the geometry, and the run-time interactions: $a_i$ and depend on the run-time excitation of the object, while $f_i$ and $d_i$ depend on the geometry and the material properties as shown below. Solving Eqn. 3, we get $$d_i = \frac{1}{2}(\alpha + \beta \lambda_i) \quad (6)$$

$$f_i = \frac{1}{2\pi}\sqrt{\lambda_i - \left(\frac{\alpha + \beta \lambda_i}{2}\right)^2} \quad (7)$$

It is feasible to assume the Rayleigh damping coefficients, $\alpha$ and $\beta$, are shape-invariant material parameters. They can be transferred to another object if it bears no drastic shape or size change. Empirical experiments were carried out to verify this, and the results are included in Appendix A. The eigenvalues Xi's are calculated from M and K and determined by the geometry and tetrahedralization as well as the material properties: in our tetrahedral finite element model, M and K depend on mass density $\rho$. Young's modulus E, and Poisson's ratio $\nu$, if we assume the material is isotropic and homogeneous.

Constraint for modes: We observe modes in the adopted linear modal synthesis model have to obey some constraint due to its formulation. Because of the Rayleigh damping model we adopted, all estimated modes lie on a circle in the $(\omega, d)$-space, characterized by $\alpha$ and $\beta$. This can be shown as follows. Rearranging Eqn. 6 and Eqn. 7 as $$\omega_i^2 + \left(d_i - \frac{1}{\beta}\right)^2 = \left(\frac{1}{\beta}\sqrt{1 - \alpha\beta}\right)^2 \quad (8)$$

we see that it takes the form of $\omega_i^2 + (d_i - y_c)^2 = R^2$ This describes a circle of radius R centered at $(0, y_c)$ in the $(\omega, d)$-space, where R and $y_c$, depend on $\alpha$ and $\beta$. This constraint for modes restricts the model from capturing some sound effects and renders it impossible to make modal synthesis sounds with Rayleigh damping exactly the same as an arbitrary real-world recording. However, if a circle that best represents the recording audio is found, it is possible to preserve the same sense of material as the recording. It is shown in Section 4 and 5.3, how a proposed pipeline achieves this.

4. Feature Extraction

An example impact sound can be represented by high-level features collectively.

We first analyze and decompose a given example audio clip into a set of features, which will later be used in the subsequent phases of our pipeline, namely the parameter estimation and residual compensation parts. Next we present the detail of our feature extraction algorithm.

Multi-level power spectrogram representation: As shown in Eqn. 5, the feature of a mode is defined as its frequency, damping, and amplitude. In order to analyze the example audio and extract these feature values, we use a time-varying frequency representation called power spectrogram. A power spectrogram P for a time domain signal s[n], is obtained by first breaking it up into overlapping frames, and then performing windowing and Fourier transform on each frame:

$$P[m, \omega] = \left| \sum_n s[n] w[n-m] e^{-j\omega n} \right|^2 \quad (9)$$

where w is the window applied to the original time domain signal [Oppenheim et al. 1989]. The power spectrogram records the signal's power spectral density within a frequency bin centered around $\omega = 2\pi f$ and a time frame defined by m.

When computing the power spectrogram for a given sound clip, one can choose the resolutions of the time or frequency axes by adjusting the length of the window w. Choosing the resolution in one dimension, however, automatically determines the resolution in the other dimension. A high frequency resolution results in a low temporal resolution, and vice versa.

To fully accommodate the range of frequency and damping for all the modes of an example audio, we compute multiple levels of power spectrograms, with each level doubling the frequency resolution of the previous one and halving the temporal resolution. Therefore, for each mode to be extracted, a suitable level of power spectrogram can be chosen first, depending on the time and frequency characteristics of the mode.

Global-to-Local Scheme:

After computing a set of multi-level power spectrograms for a recorded example audio, we globally search through all levels for peaks (local maxima) along the frequency axis. These peaks indicate the frequencies where potential modes are located, some of which may appear in multiple levels. At this step the knowledge of frequency is limited by the frequency resolution of the level of power spectrogram. For example, in the level where the window size is 512 points, the frequency resolution is as coarse as 86 Hz. A more accurate estimate of the frequency as well as the damping value is obtained by performing a local shape fitting around the peak.

Figure 3:
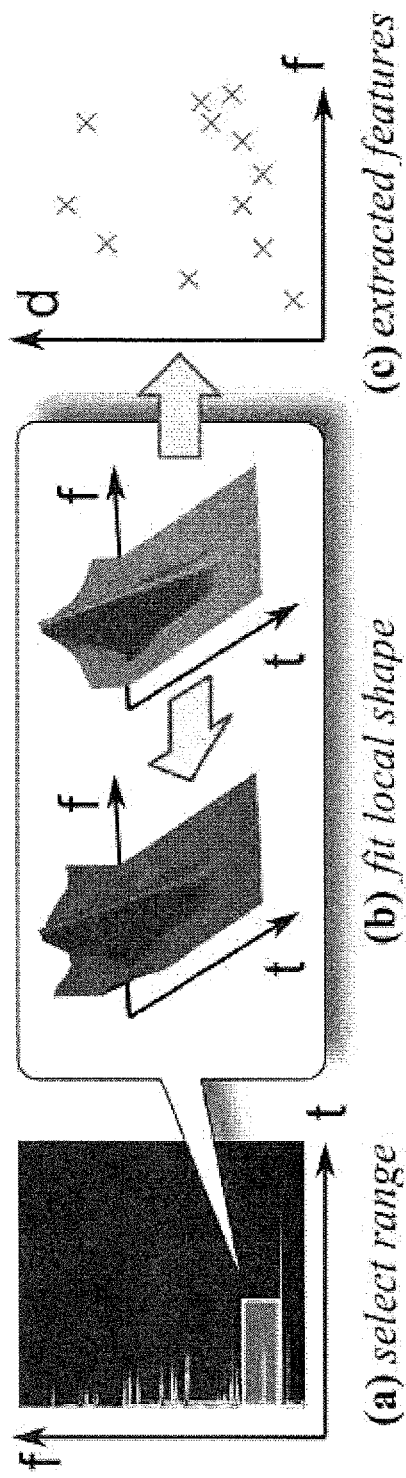
FIG. 3 is a diagram illustrating feature extraction from a power spectrogram. (a) A peak is detected in a power spectrogram at the location of a potential mode. f=frequency, t=time. (b) A local shape fitting of the power spectrogram is performed to accurately estimate the frequency, damping and amplitude of the potential mode. (c) If the fitting error is below a certain threshold, the error is collected in the set of extracted features, shown as a cross in the feature space (only the frequency f and damping d are shown in FIG. 3)

The power spectrogram of a damped sinusoid has a 'hill' shape, similar to the surface shown in the left hand graph in FIG. 3(b). The actual shape contains information of the damped sinusoid: the position and height of the peak are respectively determined by the frequency and amplitude, while the slope along the time axis and the width along the frequency axis are determined by the damping value. For a potential mode, a damped sinusoid with the initial guess of (f, d, a) is synthesized and added to the sound clip consisting of all the modes collected so far. The power spectrogram of the resulting sound clip is computed (shown as the hill shape in FIG. 3(b)), and compared locally with that of the recorded audio (the leftmost hill shape in FIG. 3(b)). An optimizer then searches in the continuous (f, d, a)-space to minimize the difference and acquire an accurate estimate of the frequency, damping, and amplitude of the mode at question. FIG. 3 illustrates this process.

The local shape fittings for all potential modes are performed in a greedy manner. Among all peaks in all levels, the algorithm starts with the one having the highest average power spectral density. If the shape fitting error computed is above a predefined threshold, we conclude that this level of power spectrogram is not sufficient in capturing the feature characteristics and thereby discard the result; otherwise the feature of the mode is collected. In other words, the most suitable time-frequency resolution (level) for a mode with a particular frequency is not predetermined, but dynamically searched for. Similar approaches have been proposed to analyze the sinusoids in an audio clip in a multi-resolution manner (e.g. Levine et al. [1998], where the time-frequency regions' power spectrogram resolution is predetermined).

We have tested the accuracy of our feature extraction with 100 synthetic sinusoids with frequencies and damping values randomly drawn from [0, 22050.0] (Hz) and [0.1, 1000]($s^{-1}$) respectively. The average relative error is 0.040% for frequencies and 0.53% for damping values, which are accurate enough for our framework.

Comparison with Existing Methods:

The SMS method [Serra and Smith III 1990] is also capable of estimating information of modes. From a power spectrogram, it tracks the amplitude envelope of each peak over time, and a similar method is adopted by Lloyd et al. [2011]. Unlike our algorithm, which fits the entire local hill shape, they only track a single peak value per time frame. In the case where the mode's damping is high or the signal's background is noisy, this method yields high error.

Another feature extraction technique was proposed by Pai et al. [2001] and Corbett et al. [2007]. The method is known for its ability to separate modes within one frequency bin. In our frame-work, however, the features are only used to guide the subsequent parameter estimation process, which is not affected much by replacing two nearly duplicate features with one. Our method also offers some advantages and achieves higher accuracy in some cases compared with theirs. First, our proposed greedy approach is able to reduce the interference caused by high energy neighboring modes. Secondly, these earlier methods use a fixed frequency-time resolution that is not necessarily the most suitable for extracting all modes, while our method selects the appropriate resolution dynamically. Detailed comparisons and data can be found in Appendix B.

5. Parameter Estimation

Using the extracted features (Sec. 4) and psychoacoustic principles (as described in this section), we introduce a parameter estimation algorithm based on an optimization framework for sound synthesis.

5.1 An Optimization Framework

We now describe the optimization work flow for estimating material parameters for sound synthesis. In the rest of this description, all data related to the example audio recordings are called reference data; all data related to the virtual object (which are used to estimate the material parameters) are called estimated data, and are denoted with a tilde, e.g. $\tilde{f}$.

Reference Sound and Features:

The reference sound is the example recorded audio, which can be expressed as a time domain signal $s[n]$. The reference features $\Phi = \{\phi_j\} = \{(f_i, d_i, a_i)\}$ are the features extracted from the reference sound, as described in Sec. 4.

Estimated Sound and Features:

In order to compute the estimated sound $\tilde{s}[n]$ and estimated features $\tilde{\Phi} = \{\tilde{\phi}_j\} = \{(\tilde{f}_i, \tilde{d}_i, \tilde{a}_i)\}$ we first create a virtual object that is roughly the same size and geometry as the real-world object whose impact sound was recorded. We then tetrahedralize it and calculate its mass matrix M and stiffness matrix K. As mentioned in Sec. 3, we assume the material is isotropic and homogeneous. Therefore, the initial M and K can be found using the finite element method, by assuming some initial values for the Young's modulus, mass density, and Poisson's ratio, $E_0$, $\rho_0$, and $\nu_0$. The assumed eigenvalues $\lambda_i^0$'s can thereby be computed. For computational efficiency, we make a further simplification that the Poisson's ratio is held as constant. Then the eigenvalue $\lambda_i$ for general E and $\rho$ is just a multiple of $\lambda_i^0$:

$$\lambda_i = \frac{\gamma}{\gamma_0} \lambda_i^0 \tag{10}$$

where $\lambda = E/\rho$ is the ratio of Young's modulus to density, and $\gamma_0 = E_0/\rho_0$ is the ratio using the assumed values.

We then apply a unit impulse on the virtual object at a point corresponding to the actual impact point in the example recording, which gives an excitation pattern of the eigenvalues as Eqn. 4. We denote the excitation amplitude of mode j as $a_j^0$. The superscript 0 notes that it is the response of a unit impulse; if the impulse is not unit, then the excitation amplitude is just scaled by a factor $\sigma$, $$a_j = \sigma a_j^0 \tag{11}$$

Combining Eqn. 6, Eqn. 7, Eqn. 10, and Eqn. 11, we obtain a mapping from an assumed eigenvalue and its excitation $(\lambda_j^0, a_j^0)$ to an estimated mode with frequency $\tilde{f}_j$, damping $\tilde{d}_j$, and amplitude $\tilde{a}_j$:

$$(\lambda_j^0, a_j^0) \xrightarrow{\{\alpha, \beta, \gamma, \sigma\}} (\tilde{f}_j, \tilde{d}_j, \tilde{a}_j) \tag{12}$$

The estimated sound $\tilde{s}[n]$, is thereby generated by mixing all the estimated modes, $$\tilde{s}[n] = \sum_j \left( \tilde{a}_j e^{-\tilde{d}_j(n/F_s)} \sin(2\pi \tilde{f}_j(n/F_s)) \right) \tag{13}$$

where $F_s$ is the sampling rate.

Difference Metric:

The estimated sound $\tilde{s}[n]$ and features $\tilde{\Phi}$ can then be compared against the reference sound $s[n]$ and features $\Phi$, and a difference metric can be computed. If such difference metric function is denoted by $\pi$, the problem of parameter estimation becomes finding $$\{\alpha, \beta, \gamma, \sigma\} = \frac{\operatorname{argmin} \Pi}{\{\alpha, \beta, \gamma, \sigma\}} \tag{14}$$

An optimization process is used to find such parameter set. The most challenging part of our work is to find a suitable metric function that can truly reflect what we view as the difference. Next we discuss the details about the metric design in Sec. 5.2 and the optimization process in Sec. 5.3.

5.2 Metric

Given an impact sound of a real-world object, the goal is to find a set of material parameters such that when they are applied to a virtual object of the same size and shape, the synthesized sounds have the similar auditory perception as the original recorded sounding object. By further varying the size, geometry, and the impact points of the virtual object, the intrinsic 'audio signature' of each material for the synthesized sound clips should closely resemble that of the original recording. These are the two criteria guiding the estimation of material parameters based on an example audio clip:

(1) the perceptual similarity of two sound clips;
(2) the audio material resemblance of two generic objects.

The perceptual similarity of sound clips can be evaluated by an 'image domain metric' quantified using the power spectrogram; while the audio material resemblance is best measured by a 'feature do-main metric'—both will be defined below, Image Domain Metric:

Given a reference sound $s[n]$ and an estimated sound $\tilde{s}[n]$, their power spectrograms are computed using Eqn. 9 and denoted as two 2D images: $I = P[m,w]$, $\tilde{I} = \tilde{P}[m,w]$. An image domain metric can then be expressed as $$\Pi_{image}(I, \tilde{I}) \tag{15}$$

Our goal is to find an estimated image $\tilde{I}$ that minimizes a given image domain metric. This process is equivalent to image registration in computer vision and medical imaging.

Feature Domain Metric:

A feature $\emptyset_i = f_i, d_i, a_i$ is essentially a three dimensional point. As established in Sec. 3, the set of features of a sounding object is closely related to the material properties of that object. Therefore a metric defined in the feature space is useful in measuring the audio material resemblance of two objects. In other words, a good estimate of material parameters should map the eigenvalues of the virtual object to similar modes as that of the real object. A feature domain metric can be written as $$\Pi_{feature}(\Phi, \tilde{\Phi}) \tag{16}$$

and the process of finding the minimum can be viewed as a point set matching problem in computer vision.

Hybrid Metric:

Both the auditory perceptual similarity and audio material resemblance would need to be considered for a generalized framework, in order to extract and transfer material parameters for modal sound synthesis using a recorded example to guide the automatic selection of material parameters. Therefore, we propose a 'hybrid' metric that takes into account both:

$$\Pi_{hybrid}(I, \Phi, \tilde{I}, \tilde{\Phi}) \tag{17}$$

Next, we provide details on how we design and compute these metrics.

5.2.1 Image Domain Metric

Given two power spectrogram images I and $\tilde{I}$, a naive metric can be defined as their squared difference: $\Pi_{image}(I,\tilde{I}) = \Sigma_{m,w}(P[m,\omega] - \tilde{P}[m,\omega])^2$. There are, however, several problems with this metric. The frequency resolution is uniform across the spectrum, and the intensity is uniformly weighted. As humans, however, we distinguish lower frequencies better than the higher frequencies, and mid-frequency signals appear louder than extremely low or high frequencies [Zwicker and Fastl 1999]. Therefore, directly taking squared difference of power spectrograms overemphasizes the frequency differences in the high-frequency components and the intensity differences near both ends of the audible frequency range. It is necessary to apply both frequency and intensity transformations before computing the image domain metric. We design these transformations based on psychoacoustic principles [Zwicker and Fastl 1999].

Figure 4:
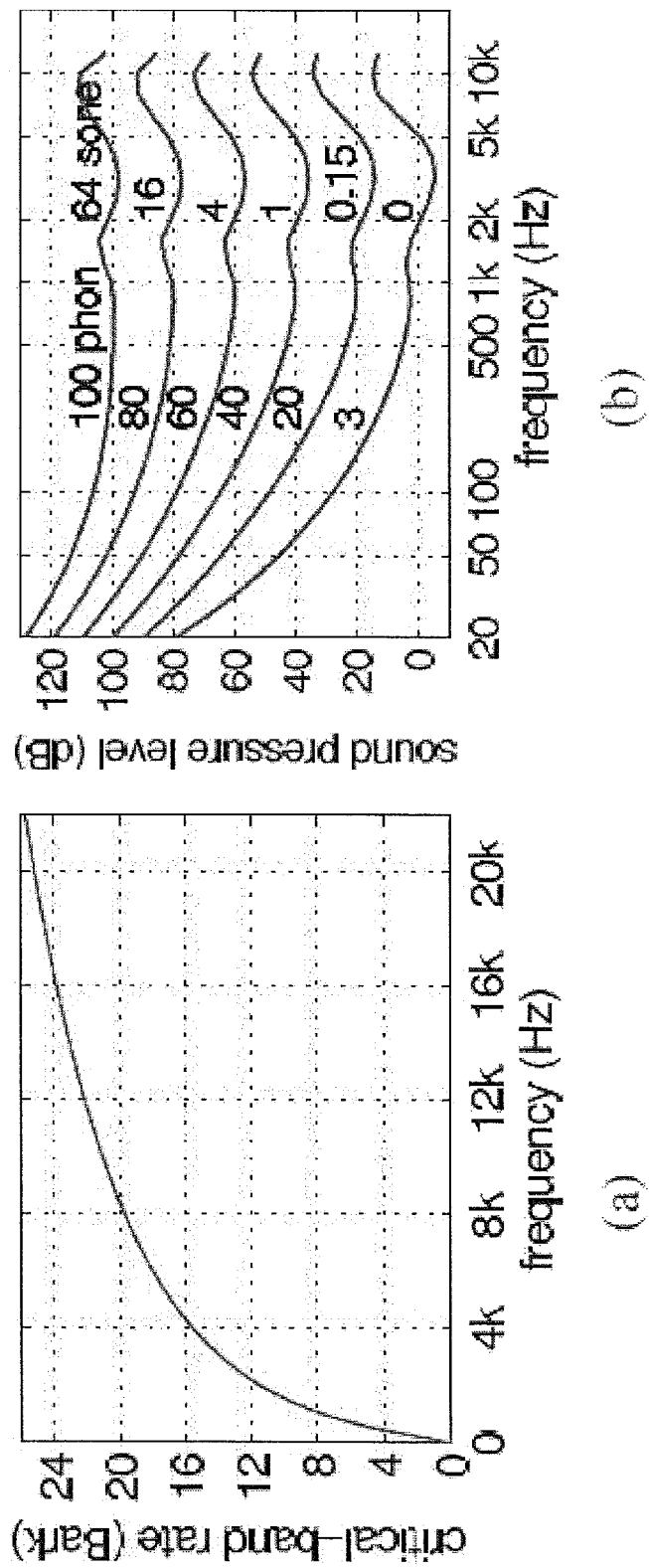
FIG. 4 illustrates graphs of psychoacoustic related values.

Frequency Transformation:

Studies in psychoacoustics suggested that humans have a limited capacity to discriminate between nearby frequencies, i.e. a frequency $f_1$ is not distinguishable from $f_2$ if $f_2$ is within $f_1 \pm \Delta f$. The indistinguishable range $\Delta f$ is itself a function of frequency, for example, the higher the frequency, the larger the indistinguishable range $\Delta f$. To factor out this variation in $\Delta f$ a different frequency representation, called critical-band rate z, has been introduced in psychoacoustics. The unit for z is Bark, and it has the advantage that while $\Delta f$ is a function of $f$ (measured in Hz), it is constant when measured in Barks. Therefore, by transforming the frequency dimension of a power spectrogram from $f$ to z, we obtain an image that is weighted according to human's perceptual frequency differences. FIG. 4a shows the relationship between critical-band rate z and frequency $f$, $z=Z(f)$.

Intensity Transformation:

Sound can be described as the variation of pressure, p(t), and human auditory system has a high dynamical range, from $10^{-5}$ Pa (threshold of hearing) to $10^2$ Pa (threshold of pain). In order to cope with such a broad range, the sound pressure level is normally used. For a sound with pressure p, its sound pressure level $L_p$, in decibel (abbreviated to dB-SPL) is defined as $$L_p = 20 \log(p/p_0), \quad (18)$$

where $p_0$ is a standard reference pressure. While $L_p$ is just a physical value, loudness L is a perceptual value, which measures human sensation of sound intensity. In between, loudness level $L_N$ relates the physical value to human sensation. Loudness level of a sound is defined as the sound pressure level of a 1-kHz tone that is perceived as loud as the sound. Its unit is phon, and is calibrated such that a sound with loudness level of 40 phon is as loud as a 1-kHz tone at 40 dB-SPL. Finally, loudness L is computed from loudness level. Its unit is sone, and is defined such that a sound of 40 phon is 1 sone; a sound twice as loud is 2 sone, and so on.

FIG. 4b shows the relationship between sound pressure level $L_p$, loudness level $L_N$ and loudness L according to the international standard [ISO 2003]. The curves are equal-loudness contours, which are defined such that for different frequency $f$ and sound pressure level $L_p$, the perceived loudness level $L_N$ and loudness L is constant along each equal-loudness contour. Therefore the loudness of a signal with a specific frequency $f$ and sound pressure level $L_p$ can be calculated by finding the equal-loudness contour passing $(f, L_p)$.

There are other psychoacoustic factors that can affect the human sensation of sound intensity. For example, van den Doel et al. [van den Doel and Pai 2002; van den Doel et al. 2004] considered the 'masking' effect, which describes the change of audible threshold in the presence of multiple stimuli, or modes in this case. However, they did not handle the loudness transform above the audible threshold, which is critical in our perceptual metric. Similar to the work by van den Doel and Pai [1998], we have ignored the masking effect.

Figure 5:
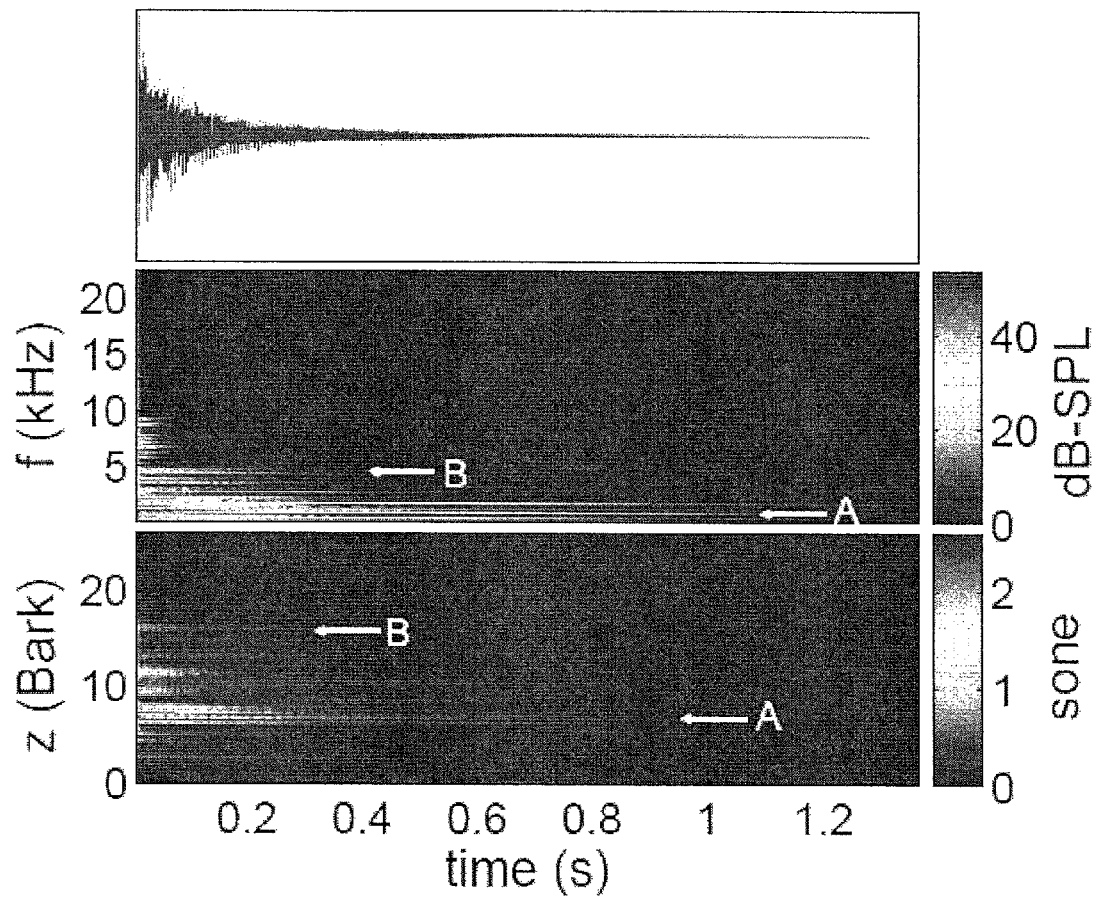
FIG. 5 is a diagram illustrating different representations of a sound clip. In topmost diagram, a time domain signal s[n] is shown. In the middle diagram, the original image and power spectrogram p[n,w] with intensity measured in decibels is shown. In the bottom diagram, an image transformed based on psychoacoustic principles is shown. The frequency f is transformed to the critical band rate z, and the intensity is transformed to loudness. Two pairs of corresponding nodes are marked as (a) and (d). It can be seen that the frequency resolution decreases toward higher frequencies, while the signal intensities in both the higher and lower ends of the spectrum are deemphasized.

Psychoacoustic Metric:

After transforming the frequency $f$ (or equivalently, $\omega$) to the critical-band rate z and mapping the intensity to loudness, we obtain a transformed image $T(I)=T(I)[m,z]$. Different representations of a sound signal are shown in FIG. 5. Then we can define a psychoacoustic image domain metric as $$\Pi_{psycho}(I, \tilde{I}) = \sum_{m,z} (T(I)[m,z] - T(\tilde{I})[m,z])^2 \quad (19)$$

Similar transformations and distance measures have also been used to estimate the perceived resemblance between music pieces [Morchen et al. 2006; Pampalk et al. 2002].

5.2.2 Feature Domain Metric

Figure 6:
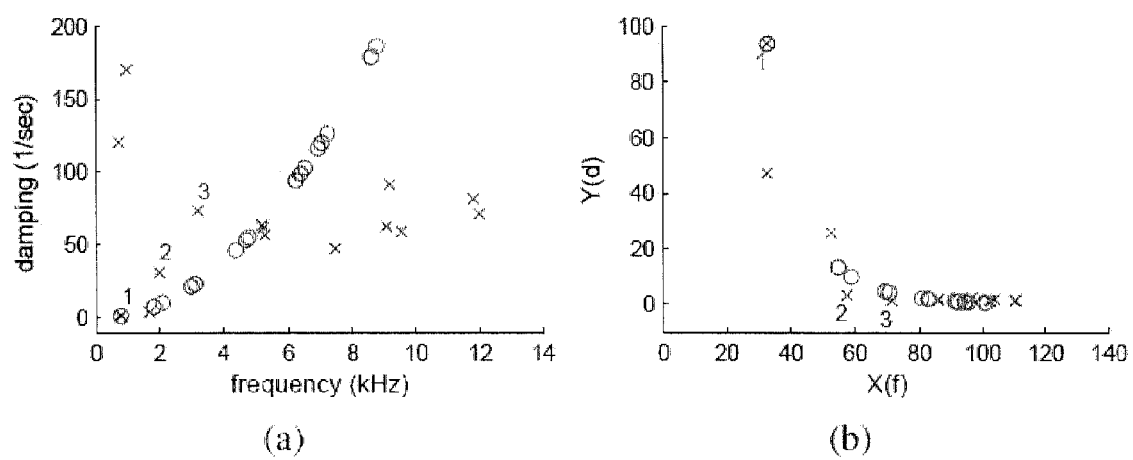
FIG. 6 illustrates graphs of a point matching set problem in the feature domain.

As shown in Eqn. 8, in the $(\omega,d)$-space, modes under the assumption of Rayleigh damping lie on a circle determined by damping parameters $\alpha$ and $\beta$, while features extracted from example recordings can be anywhere. Therefore, it is challenging to find a good match between the reference features $\Phi$ and estimated features $\tilde{\Phi}$. FIG. 6(a) shows a typical matching in the $(f,d)$-space. Next we present a feature domain metric that evaluates such a match.

In order to compute the feature domain metric, we first transform the frequency and damping of feature points to another different 2D space. Namely, from $(f_i, d_i)$ to $(x_i, y_i)$, where $x_i = X(f_i)$ and $y_i = Y(d_i)$ encode the frequency and damping information respectively. With suitable transformations, the Euclidean distance defined in the transformed space can be more useful and meaningful for representing the perceptual difference. The distance between two feature points is thus written as $$D(\phi_i, \tilde{\phi}_j) = \|(X(f_i), Y(d_i)) - (X(\tilde{f}_j), Y(\tilde{d}_j))\| \quad (20)$$

Frequency and damping are key factors in determining material agreement, while amplitude indicates relative importance of modes. That is why we measure the distance between two feature points in the 2D $(f,d)$-space and use amplitude to weigh that distance For frequency, as described in Sec. 5.2.1 we know that the frequency resolution of human is constant when expressed as critical-band rate and measured in Barks: $\Delta f(f) \propto \Delta z$. Therefore it is a suitable frequency transformation $$X(f) = c_z Z(f) \quad (21)$$

where $c_z$ is some constant coefficient.

For damping, although human can roughly sense that one mode damps faster than another, directly taking the difference in damping value d is not feasible. This is due to the fact that humans cannot distinguish between extremely short bursts [Zwicker and Fastl 1999]. For a damped sinusoid, the inverse of the damping value, $1/d_i$, is proportional to its duration, and equals to how long before the signal decays to $e^{-1}$ of its initial amplitude. While distance measured in damping values overemphasizes the difference between signals with high d values (corresponding to short bursts), distance measured in durations does not. Therefore $$Y(d) = c_d \frac{1}{d} \quad (22)$$

(where $c_d$ is some constant coefficient) is a good choice of damping transformation. The reference and estimated features of data in FIG. 6(a) are shown in the transformed space in FIG. 6(b).

Having defined the transformed space, we then look for matching the reference and estimated feature points in this space. Our matching problem belongs to the category where there is no known correspondence, i.e. no prior knowledge about which point in one set should be matched to which point in another. Furthermore, because there may be several estimated feature points in the neighborhood of a reference point or vice versa, the matching is not necessarily a one-to-one relationship. There is also no guarantee that an exact matching exist, because (1) the recorded material may not obey the Rayleigh damping model, (2) the discretization of the virtual object and the assumed hit point may not give the exact eigenvalues and excitation pattern of the real object. Therefore we are merely looking for a partial, approximate matching.

The simplest point-based matching algorithm that solves problems in this category (i.e. partial, approximate matching without known correspondence) is Iterative Closest Points. It does not work well, however, when there is a significant number of feature points that cannot be matched [Besl and McKay 1992], which is possibly the case in our problem. Therefore, we define a metric, Match Ratio Product, that meets our need and is discussed next.

For a reference feature point set $\Phi$, we define a match ratio that measures how well they are matched by an estimated feature point set $\tilde{\Phi}$. This set-to-set match ratio, defined as $$R(\Phi, \tilde{\Phi}) = \frac{\sum_i \omega_i R(\phi_i, \tilde{\Phi})}{\sum_i \omega_i} \quad (23)$$

is a weighted average of the point-to-set match ratios, which are in turn defined as $$R(\phi_i, \tilde{\Phi}) = \frac{\sum_j u_{ij} k(\phi_i, \tilde{\phi}_j)}{\sum_j u_{ij}} \quad (24)$$

a weighted average of the point-to-point match scores $k(\phi_i, \tilde{\phi}_j)$. The point-to-point match score $k(\phi_i, \tilde{\phi}_j)$, which is directly related to the distance of feature points (Eqn. 20), should be designed to give values in the continuous range [0, 1], with 1 meaning that the two points coincide, and 0 meaning that they are too far apart. Similarly $R(\Phi, \tilde{\Phi})=1$ when $\phi_i$ coincides with an estimated feature point, and $R(\Phi, \tilde{\Phi})=1$ when all reference feature points are perfectly matched. The weight $\omega_i$ and $u_{ij}$ in Eqn. 23 and Eqn. 24 are used to adjust the influence of each mode. The match ratio for the estimated feature points, $\tilde{R}$, is defined analogously $$\tilde{R}(\Phi, \tilde{\Phi}) = \frac{\sum_j \tilde{\omega}_j R(\tilde{\phi}_j, \Phi)}{\sum_j \tilde{\omega}_j} \quad (25)$$

The match ratios for the reference and the estimated feature point sets are then combined to form the Match Ratio Product (MRP), which measures how well the reference and estimated feature point sets match with each other, $$\Pi_{MRP}(\Phi, \tilde{\Phi}) = -R\tilde{R} \quad (26)$$

The negative sign is to comply with the minimization framework. Multiplying the two ratios penalizes the extreme case where either one of them is close to zero (indicating poor matching).

The normalization processes in Eqn. 23 and Eqn. 25 are necessary. Notice that the denominator in Eqn. 25 is related to the number of estimated feature points inside the audible range, $\tilde{N}_{audible}$ (in fact $\Sigma_j \tilde{\omega}_j = \tilde{N}_{audible}$ if all $\tilde{\omega}_j = 1$). Depending on the set of parameters, $\tilde{N}_{audible}$ can vary from a few to thousands. Factoring $\tilde{N}_{audible}$ prevents the optimizer from blindly introducing more modes into the audible range, which may increase the absolute number of matched feature points, but may not necessarily increase the match ratios. Such averaging techniques have also been employed to improve the robustness and discrimination power of point-based object matching methods [Dubuisson and Jain 1994; Gope and Kehtarnavaz 2007].

In practice, the weights $\omega$'s and if $u$'s, can be assigned according to the relative energy or perceptual importance of the modes. The point-to-point match score $k(\phi_i, \tilde{\phi}_j)$, can also be tailored to meet different needs. The constants and function forms used in this section are listed in Appendix C.

5.2.3 Hybrid Metric

Finally, we combine the strengths from both image and feature domain metrics by defining the following hybrid metric:

$$\Pi_{hybrid} = \frac{\Pi_{psycho}}{|\Pi_{MRP}|} \quad (27)$$

This metric essentially weights the perceptual similarity with how well the features match, and by making the match ratio product as the denominator, we ensure that a bad match (low MRP) will boost the metric value and is therefore highly undesirable.

5.3 Optimizer

We use the Nelder-Mead method [Lagarias et al. 1999] to minimize Eqn. 14, which may converge into one of the many local minima. We address this issue by starting the optimizer from many starting points, generated based on the following observations.

First, as elaborated by Eqn. 8 in Sec. 3, the estimated modes are constrained by a circle in the $(\omega,d)$-space. Secondly, although there are many reference modes, they are not evenly excited by a given impact—we observe that usually the energy is mostly concentrated in a few dominant ones. Therefore, a good estimate of $\alpha$ and $\beta$ must define a circle that passes through the neighborhood of these dominant reference feature points. We also observe that in order to yield a low metric value, there must be at least one dominant estimated mode at the frequency of the most dominant reference mode.

We thereby generate our starting points by first drawing two dominant reference feature points from a total of $N_{dominant}$ of them, and find the circle passing through these two points. This circle is potentially a 'good' circle, from which we can deduce a starting estimate of $\alpha$ and $\beta$ using Eqn. 8. We then collect a set of eigenvalues and amplitudes (defined in Sec. 5.1) $\{(\lambda_j^0, a_j^0)\}$, such that there does not exist any $(\lambda_k^0, a_k^0)$ that simultaneously satisfies $\lambda_k^0 < \lambda_j^0$ and $a_k^0 > a_j^0$. It can be verified that the estimated modes mapped from this set always includes the one with the highest energy, for any mapping parameters $\{\alpha, \beta, \gamma, \sigma\}$ used in Eqn. 12. Each $(\lambda_j^0, a_j^0)$ in this set is then mapped and aligned to the frequency of the most dominant reference feature point, and its amplitude is adjusted to be identical as the latter. This step gives a starting estimate of $\gamma$ and $\sigma$. Each set of $\{\alpha, \beta, \gamma, \sigma\}$ computed in this manner is a starting point, and may lead to a different local minimum. We choose the set which results in the lowest metric value to be our estimated parameters. Although there is no guarantee that a global minimum will be met, we find that the results produced with this strategy are satisfactory in our experiments, as discussed in Sec. 7.

6. Residual Compensation

With the optimization proposed in Sec. 5, a set of parameters that describe the material of a given sounding object can be estimated, and the produced sound bears a close resemblance of the material used in the given example audio. However, linear modal synthesis alone is not capable of synthesizing sounds that are as rich and realistic as many real-world recordings. Firstly, during the short period of contact, not all energy is transformed into stable vibration that can be represented with a small number of damped sinusoids, or modes. The stochastic and transient nature of the non-modal components makes sounds in nature rich and varying. Secondly, as discussed in Sec. 3, not all features can be captured due to the constraints for modes in the synthesis model. In this section we present a method to account for the residual, which approximates the difference between the real-world recordings and the modal synthesis sounds. In addition, we propose a technique for transferring the residual with geometry and interaction variation. With the residual computation and transfer algorithms introduced below, more realistic sounds that automatically vary with geometries and hitting points can be generated with a small computation overhead.

6.1 Residual Computation

In this section we discuss how to compute the residual from the recorded sound and the synthesized modal sound generated with the estimated parameters.

Previous works have also looked into capturing the difference between a source audio and its modal component [Serra and Smith III 1990; Serra 1997; Lloyd et al. 2011]. In these works, the modal part is directly tracked from the original audio, so the residual can be calculated by a straightforward subtraction of the power spectrograms. The synthesized modal sound in our framework, however, is generated solely from the estimated material parameters. Although it preserves the intrinsic quality of the recorded material, in general the modes in our synthesized sounds are not perfectly aligned with the recorded audio. An example is shown in FIG. 7(a) and FIG. 7(c). It is due to the constraints in our sound synthesis model and discrepancy between the discretized virtual geometries and the real-world sounding objects. As a result, direct subtraction does not work in this case to generate a reasonable residual. Instead, we first compute an intermediate data, called the represented sound. It corresponds to the part in the recorded sound that is captured, or represented, by our synthesized sound. This represented sound (FIG. 7(d)) can be directly subtracted from the recorded sound to compute the residual (FIG. 7(e)).

The computation of the represented sound is based on the following observations. Consider a feature (described by $\phi_i$) extracted from the recorded audio. If it is perfectly captured by the estimated modes, then it should not be included in the residual and should be completely subtracted from the recorded sound. If it is not captured at all, it should not be subtracted from the recorded sound, and if it is approximated by an estimated mode, it should be partially subtracted. Since features closely represent the original audio, they can be directly subtracted from the recorded sound.

The point-to-set match ratio $R(\phi_i, \tilde{\Phi})$ proposed in Sec. 5.2 essentially measures how well a reference feature $\phi_i$ is represented (matched) by all the estimated modes. This match ratio can be conveniently used to determine how much of the corresponding feature should be subtracted from the recording.

Figure 7:
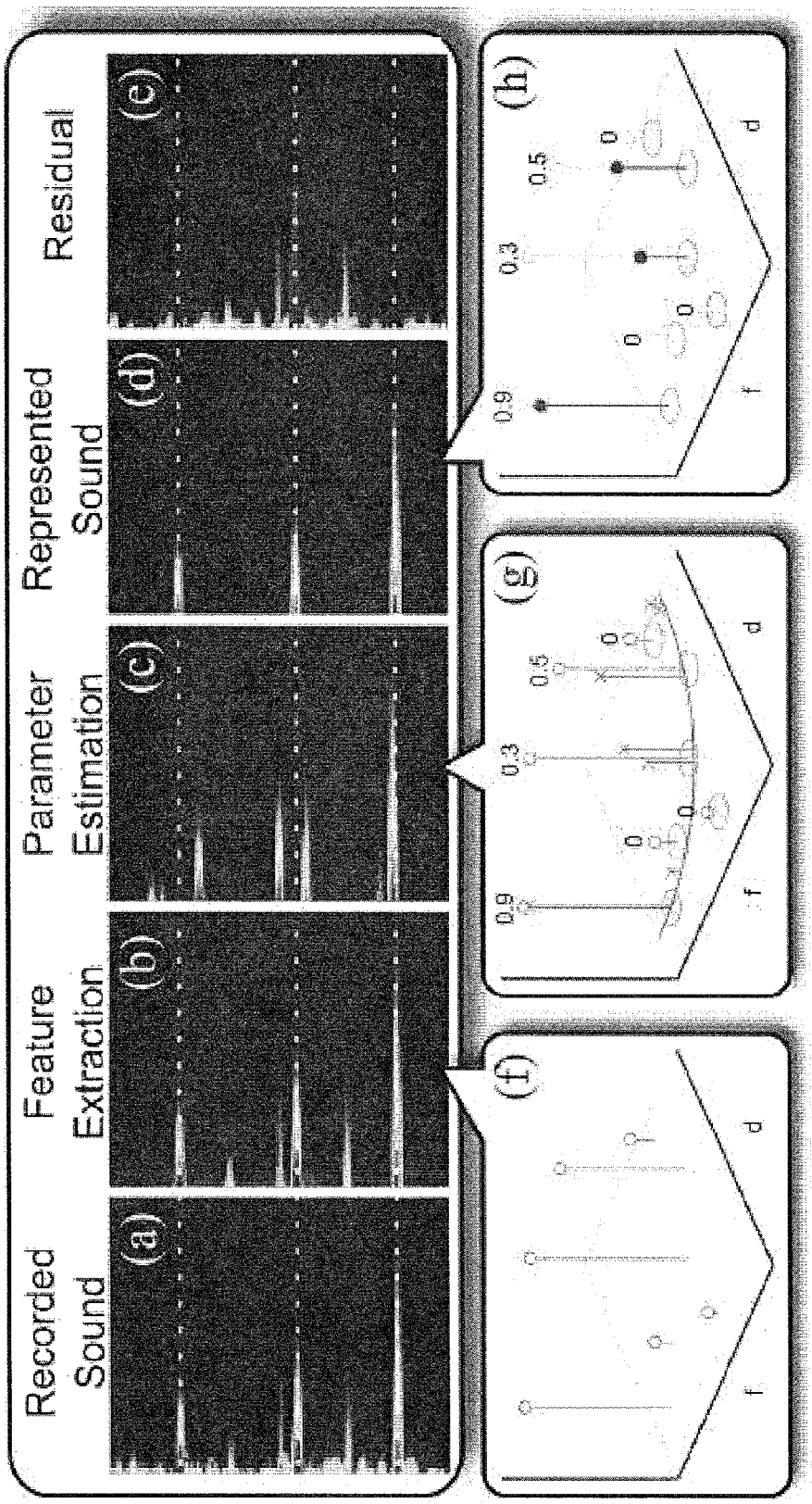
FIG. 7 illustrates residual computation. From a recorded sound (a), the reference features are extracted (b), with frequencies, dampings, and energies depicted as the circles in (f). After parameter estimation, the synthesized sound is generated (c), with the estimated features shown as the crosses in (g), which all lie on a curve in the (f, d)-plane. Each reference feature may be approximated by one or more estimated features, and its match ratio number is shown. The represented sound is the summation of the reference features weighted by their match ratios, shown as the solid circles at the top of each line in (h). Finally, the difference between the recorded sound's power spectrogram (a) and the represented sound's power spectrogram (d) are computed to obtain the residual (e)
Figure 8:
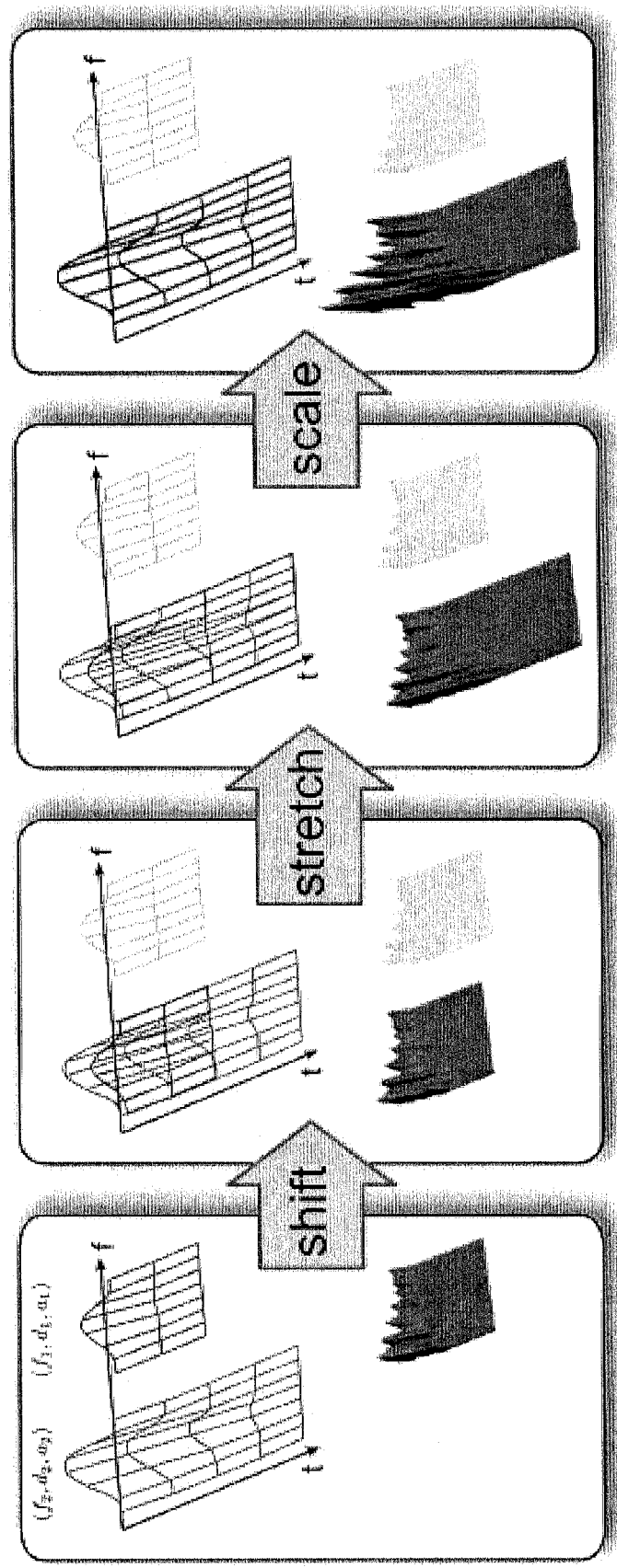
FIG. 8 illustrates single mode residual transformation. The power spectrogram of a source mode ($f_1$, $d_1$, $a_1$) (the smaller wireframe), is transformed to a target mode ($f_2$, $d_2$, $a_2$) (the larger wireframe), through frequency-shifting, time-stretching, and height-scaling. The residual power spectrogram (the solid surface at the bottom of each figure) is transformed in the exact same way.

The represented sound is therefore obtained by adding up all the reference features that are respectively weighted by the match ratio of the estimated modes. And the power spectrogram of the residual is obtained by subtracting the power spectrogram of the represented sound from that of the recorded sound. FIG. 7 illustrates the residual computation process.

6.2 Residual Transfer

Residual of one particular instance (i.e. one geometry and one hit point) can be obtained through the above described residual computation method. However, when synthesizing sounds for a different geometry undergoing different interaction with other rigid bodies, the residual audio needs to vary accordingly. Lloyd et al. [2011] proposed applying a random dip filter on the residual to provide variation. While this offers an attractive solution for quickly generating modified residual sound, it does not transfer accordingly with the geometry change or the dynamics of the sounding object.

6.2.1 Exemplary Algorithm

As discussed in previous sections, modes transfer naturally with geometries in the modal analysis process, and they respond to excitations at runtime in a physical manner. In other words, the modal component of the synthesized sounds already provides transferability of sounds due to varying geometries and dynamics. Hence, we compute the transferred residual under the guidance of modes as follows.

Given a source geometry and impact point, we know how to transform its modal sound to a target geometry and impact points. Equivalently, we can describe such transformation as acting on the power spectrograms, transforming the modal power spectrogram of the source, $P_{modal}^s$ to that of the target, $P_{modal}^t$:

$$P_{modal}^s \overset{H}{\to} P_{modal}^t \tag{28}$$

where H is the transform function. We apply the same transform function H to the residual power spectrograms $$P_{residual}^s \overset{H}{\to} P_{residual}^t \tag{29}$$

where the source residual power spectrogram is computed as described in Sec. 6.1.

More specifically, H can be decomposed into per-mode transform functions, $H_{i,j}$, which transforms the power spectrogram of a source mode $\phi_i^s=(f_i^s,d_i^s,a_i^s)$ to a target mode $\phi_j^t=(f_j^t,d_j^t,a_j^t)$. $H_{i,j}$, can further be described as a series of operations on the source power spectrogram $P_{modal}^s$: (1) the center frequency is shifted from $f_i^s$ to $f_i^t$; (2) the time dimension is stretched according to the ratio between $d_i^s$ and $d_i^t$; (3) the height (intensity) is scaled pixel-by-pixel to match $P_{modal}^t$. The per-mode transform is performed in the neighborhood of $f_i^s$, namely between $\frac{1}{2}(f_{i-1}^s+f_i^s)$ and $\frac{1}{2}(f_i^s+f_{i+1}^s)$, to that of $f_j^t$ namely between $\frac{1}{2}(f_{j-1}^t+f_j^t)$ and $\frac{1}{2}(f_j^t+f_{j+1}^t)$.

The per-mode transform is performed for all pairs of source and target modes, and the local residual power spectrograms are 'stitched' together to form the complete $P_{residual}^t$. Finally, the time-domain signal of the residual is reconstructed from $P_{residual}^t$, using an iterative inverse STFT algorithm by Griffin and Lim [2003]. Algorithm 1 shows the complete feature-guided residual transfer algorithm. With this scheme, the transform of the residual power spectrogram is completely guided by the appropriate transform of modes. The resulting residual changes consistently with the modal sound. Since the modes transform with the geometry and dynamics in a physical manner, the transferred residual also faithfully reflects this variation.

---

Algorithm 1: Residual Transformation at Runtime

Input: source modes $\Phi^s = \{\phi_i^s\}$, target modes $\Phi^t = \{\phi_j^t\}$, and
    source residual audio $s_{residual}^s[n]$
Output: target residual audio $s_{residual}^t[n]$
$\Psi \leftarrow$ DetermineModePairs($\Phi^s, \Phi^t$)
foreach mode pair $(\phi_k^s, \phi_k^t) \in \Psi$ do
  | $P^{s\prime} \leftarrow$ ShiftSpectrogram($P^s$, $\Delta$frequency)
  | $P^{s\prime\prime} \leftarrow$ StretchSpectrogram($P^{s\prime}$, damping_ratio)
  | $A \leftarrow$ FindPixelScale($P^t$, $P^{s\prime\prime}$)
  | $P_{residual}^{s\prime} \leftarrow$ ShiftSpectrogram($P_{residual}^s$, $\Delta$frequency)
  | $P_{residual}^{s\prime\prime} \leftarrow$ StretchSpectrogram($P_{residual}^{s\prime}$, damping_ratio)
  | $P_{residual}^{t\prime\prime\prime} \leftarrow$ MultiplyPixelScale($P_{residual}^{s\prime\prime}$, A)
  | $(\omega_{start}, \omega_{end}) \leftarrow$ FindFrequencyRange($\phi_{k-1}^t, \phi_k^t$)
  | $P_{residual}^t[m, \omega_{start}, \ldots, \omega_{end}] \leftarrow P_{residual}^{t\prime\prime\prime}[m, \omega_{start}, \ldots, \omega_{end}]$
end
$s_{residual}^t[n] \leftarrow$ IterativeInverseSTFT($P_{residual}^t$)

---

Note that a 'one-to-one mapping' between the source and target modes is required. If the target geometry is a scaled version of the source geometry, then there is a natural correspondence between the modes. If the target geometry, however, is of different shape from the source one, such natural correspondence does not exist. In this case, we pick the top $N_{dominant}$ modes with largest energies from both sides, and pair them from low frequency to high frequency.

6.2.2 Exemplary Implementation and Performance

The most computation costly part of residual transfer is the iterative inverse STFT process. We are able to obtain acceptable time-domain reconstruction from the power spectrogram when we limit the iteration of inverse SIFT to 10. Hardware acceleration is used in our implementation to ensure fast STFT computation. More specifically, CUFFT, a CUDA implementation of Fast Fourier Transform, is adopted for parallelized inverse STFT operations. Also note that residual transfer computation only happens when there is a contact event, the obtained time-domain residual signal can be used until the next event.

On an NVIDIA GTX 480 graphics card, if the contact events arrive at intervals around $\frac{1}{30}s$, the residual transfer in the current implementation can be successfully evaluated in time.

7. Results and Analysis

Figure 9:
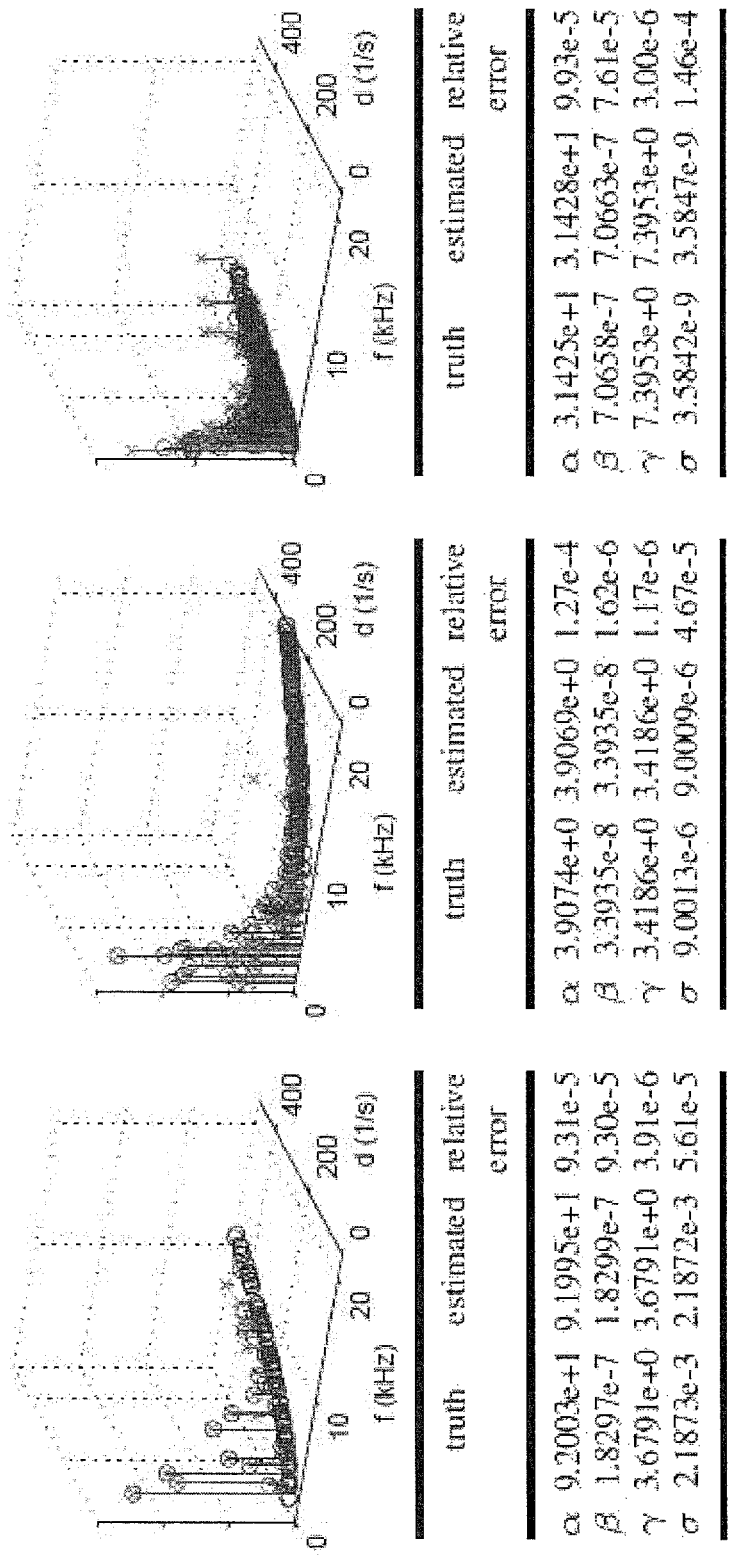
FIG. 9 illustrates results of estimating material parameters using synthetic sound clips. The intermediate results of the feature extraction step are visualized in the plots. Each circle represents a synthesized feature, whose coordinates (x, y, z) denote the frequency, damping, and energy of the mode. The crosses represent the extracted features. The tables show the truth value, estimated value, and relative error for each of the parameters.

Parameter Estimation:

Before working on real-world recordings, we design an experiment to evaluate the effectiveness of our parameter estimation with synthetic sound clips. A virtual object with known material parameters $\{\alpha,\beta,\gamma,\sigma\}$ and geometry is struck, and a sound clip is synthesized by mixing the excited modes. The sound clip is entered to the parameter estimation pipeline to test if the same parameters are recovered. Three sets of parameters are tested and the results are shown in FIG. 9.

This experiment demonstrates that if the material follows the Rayleigh damping model, the proposed framework is capable of estimating the material parameters with high accuracy. Below we will see that real materials do not follow the Rayleigh damping model exactly, but the presented framework is still capable of finding the closest Rayleigh damping material that approximates the given material.

Figure 10:
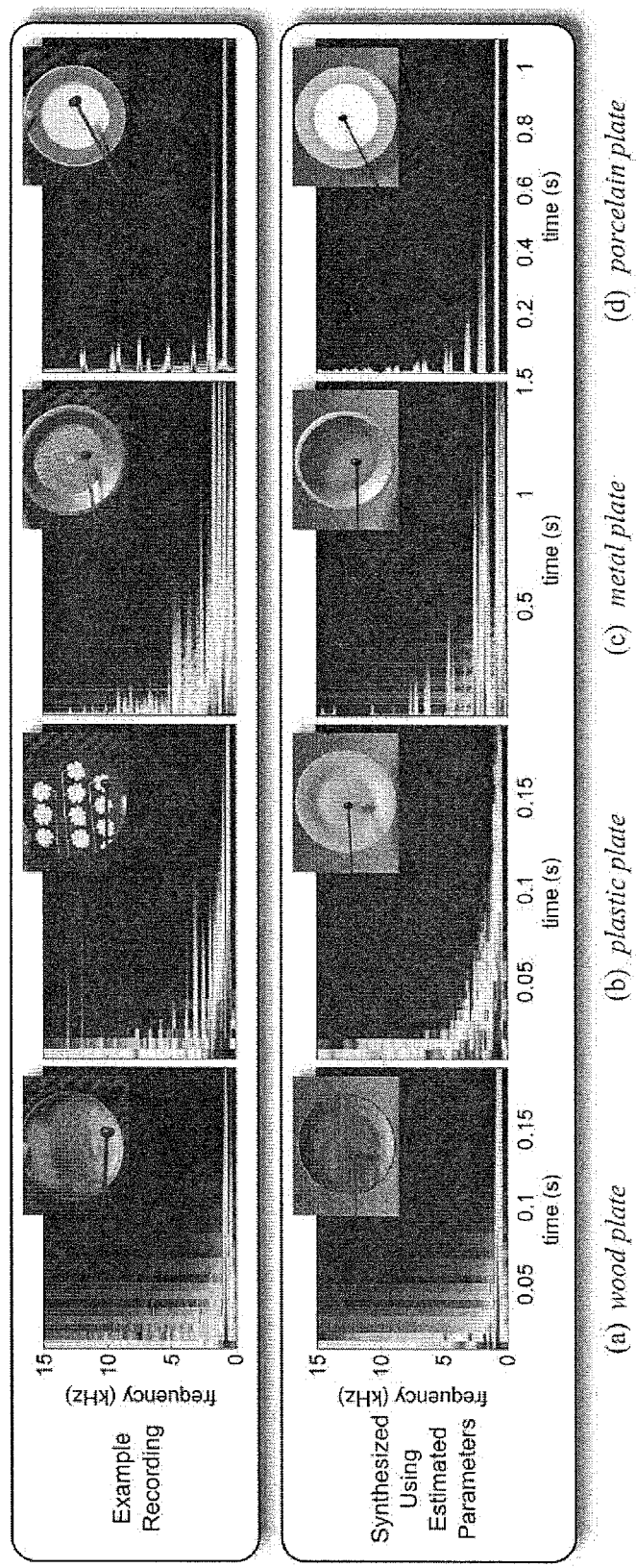
FIG. 10 illustrates parameter estimation for different materials. For each material, the material parameters are estimated using an example recorded audio (top row). Applying the estimated parameters to a virtual object with the same geometry as the real object used in recording the audio will produce a similar sound (bottom row)

We estimate the material parameters from various real-world audio recordings: a wood plate, a plastic plate, a metal plate, a porcelain plate, and a glass bowl. For each recording, the parameters are estimated using a virtual object that is of the same size and shape as the one used to record the audio clips. When the virtual object is hit at the same location as the real-world object, it produces a sound similar to the recorded audio, as shown in FIG. 10 and the supplementary video.

Figure 11:
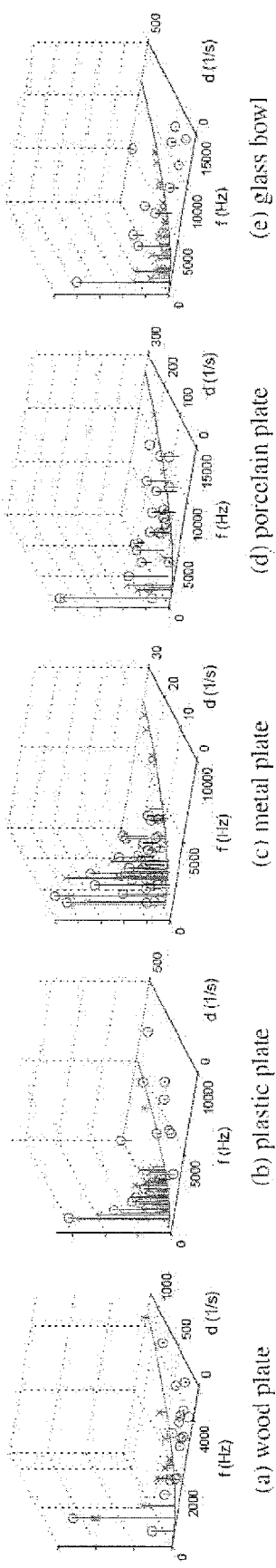
FIG. 11 illustrates feature comparison of real and virtual objects. The circles represent the reference features extracted from the recordings of the real objects. The crosses are the features of the virtual objects using the estimated parameters. Because of the Rayleigh damping model, all the features of a virtual object lie on the depicted curve on the (f, d)-plane.

FIG. 11 compares the reference features of the real-world objects and the estimated features of the virtual objects as a result of the parameter estimation. The parameter estimated for these materials are shown in Table I.

Transferred Parameters and Residual:

The parameters estimated can be transferred to virtual objects with different sizes and shapes. Using these material parameters, a different set of resonance modes can be computed for each of these different objects. The sound synthesized with these modes preserves the intrinsic material quality of the example recording, while naturally reflect the variation in virtual object's size, shape, and interactions in the virtual environment.

TABLE I

Estimated parameters

| Material | Parameters | | | |
|---|---|---|---|---|
| | $\alpha$ | $\beta$ | $\gamma$ | $\sigma$ |
| Wood | 2.1364e+0 | 3.0828e−6 | 6.6625e+5 | 3.3276e−6 |
| Plastic | 5.2627e+1 | 8.7753e−7 | 8.9008e+4 | 2.2050e−6 |
| Metal | 6.3035e+0 | 2.1160e−8 | 4.5935e+5 | 9.2624e−6 |
| Glass | 1.8301e+1 | 1.4342e−7 | 2.0282e+5 | 1.1336e−6 |
| Porcelain | 3.7388e−2 | 8.4142e−8 | 3.7068e+5 | 4.3800e−7 |

Refer to Sec. 3 and Sec. 5 for the definition and estimation of these parameters.

Moreover, taking the difference between the recording of the example real object and the synthesized sound from its virtual counterpart, the residual is computed. This residual can also be transferred to other virtual objects, using methods described in Sec. 6.

Figure 12:
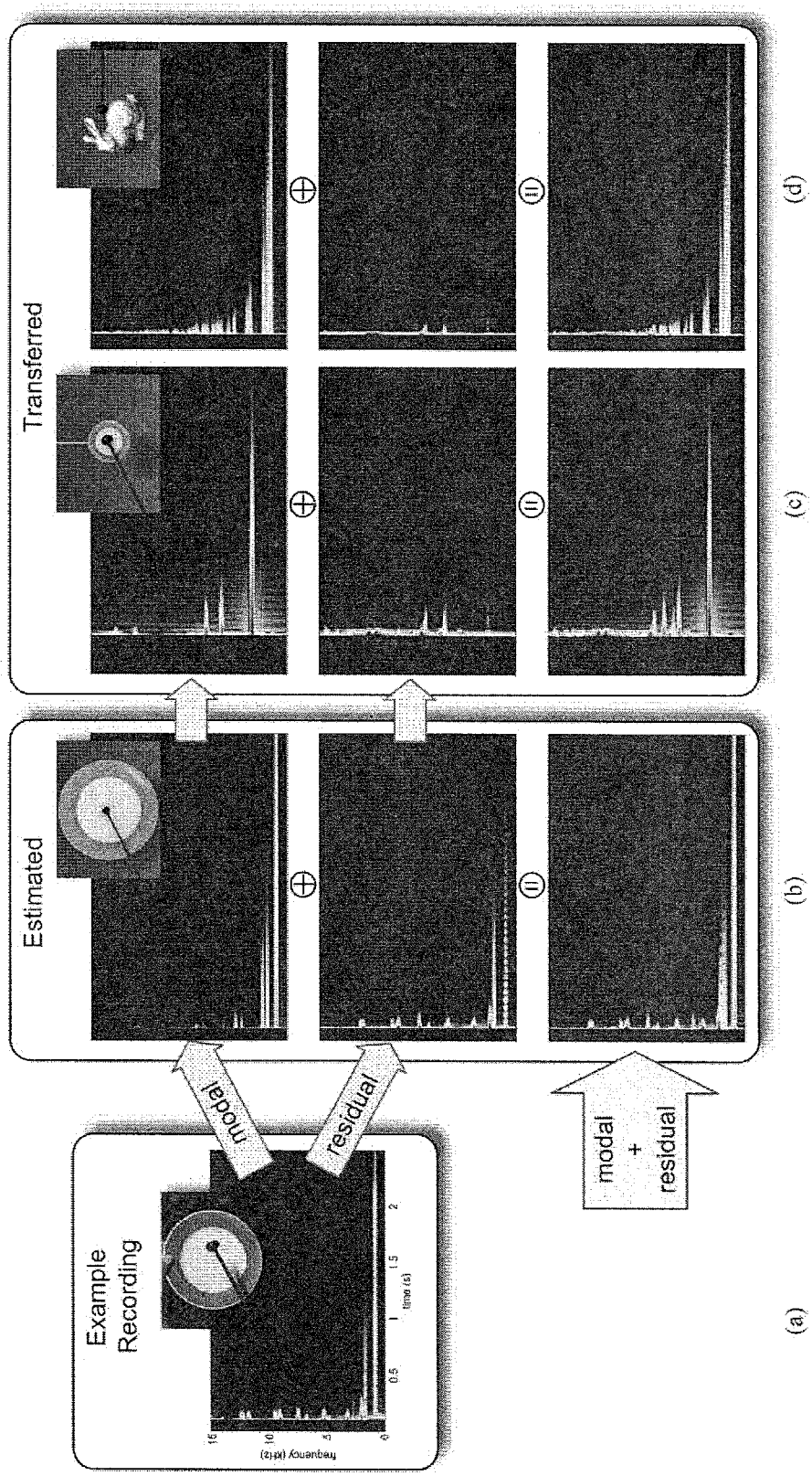
FIG. 12 illustrates transferred material parameters and residual: from a real-world recording (a), the material parameters are estimated and the residual computed (b). The parameters and residual can then be applied to various objects made of the same material, including (c) a smaller object with similar shape; (d) an object with different geometry. The transferred modes and residuals are combined to form the final results (bottom row)

FIG. 12 gives an example of this transferring process. From an example recording of a porcelain plate (a), the parameters for the porcelain material are estimated, and the residual computed (b). The parameters and residual are then transferred to a smaller porcelain plate (c) and a porcelain bunny (d).

Figure 13:
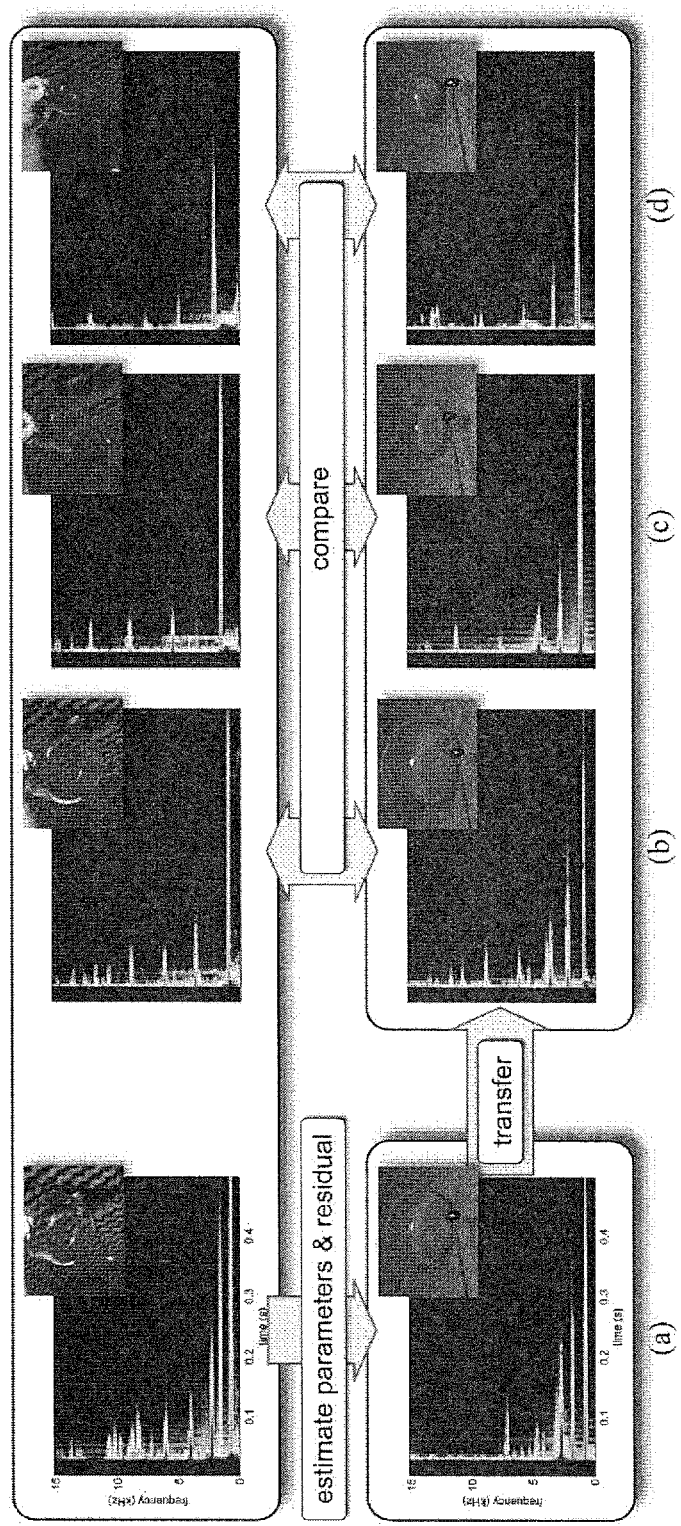
FIG. 13 illustrates a comparison of transferred results with real-word recordings: from one recording (column (a), top), the optimal parameters and residual are estimated, and a similar sound is reproduced (column (a), bottom). The parameters and residual can then be applied to different objects of the same material ((b), (c), (d), bottom), and the results are comparable to the real-world recordings ((b), (c), (d), top)

Comparison with Real Recordings:

FIG. 13 shows a comparison of the transferred results with the real recordings. From a recording of glass bowl, the parameters for glass are estimated (column (a)) and transferred to other virtual glass bowls of different sizes. The synthesized sounds ((b) (c) (d), bottom row) are compared with the real-world audio for these different-sized glass bowls ((b) (c) (d), top row). It can be seen that although the transferred sounds are not identical to the recorded ones, the overall trend in variation is similar. Moreover, the perception of material is preserved, as can be verified in the accompanying video. More examples of transferring the material parameters as well as the residuals are demonstrated in the accompanying video.

Example

A Complicated Scenario

Figure 14:
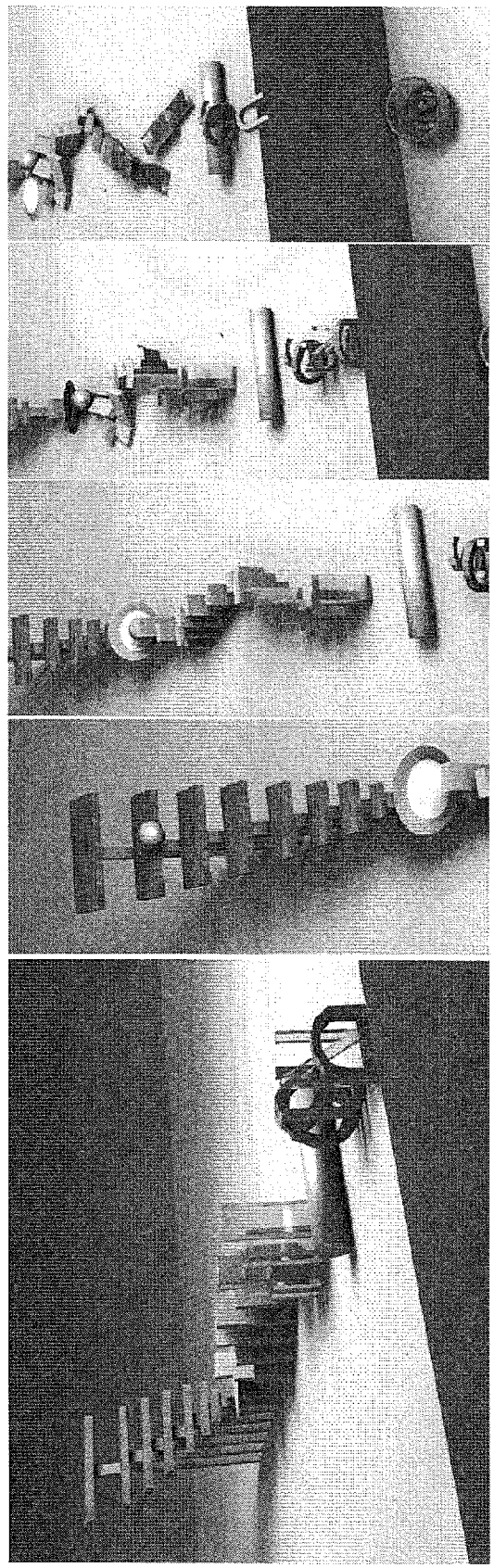
FIG. 14 illustrates estimated parameters that are applied to virtual objects of various sizes and shapes, generating sounds corresponding to all kinds of interactions such as colliding, rolling, and sliding.

We applied the estimated parameters for various virtual objects in a scenario where complex interactions take place, as shown in FIG. 14 and the accompanying video.

Performance:

Table II shows the timing for our system running on a single core of a 2.80 GHz Intel Xeon X5560 machine. It should be noted that the parameter estimation is an offline process: it needs to be run only once per material, and the result can be stored in a database for future reuse.

For each material in column one, multiple starting points are generated first as described in Sec. 5.3, and the numbers of starting points are shown in column two. From each of these starting points, the optimization process runs for an average number of iterations (column three) until convergence. The average time taken for the process to converge is shown in column four. The convergence is defined as when both the step size and the difference in metric value are lower than their respective tolerance values, $\Delta_x$, and $\Delta_{metric}$. The numbers reported in Table II are measured with $\Delta_x$=1e-4 and $\Delta_{metric}$=1e-8.

TABLE II

Offline Computation for Material Parameter Estimation

| Material | #starting points | average #iteration | average time (s) |
|---|---|---|---|
| Wood | 60 | 1011 | 46.5 |
| Plastic | 210 | 904 | 49.4 |
| Metal | 50 | 1679 | 393.5 |
| Porcelain | 80 | 1451 | 131.3 |
| Glass | 190 | 1156 | 68.9 |

8. Perceptual Study

To assess the effectiveness of our parameter estimation algorithm, we designed an experiment to evaluate the auditory perception of the synthesized sounds of five different materials. Each subject is presented with a series of 24 audio clips with no visual image or graphical animation. Among them, 8 are audio recordings of sound generated from hitting a real-world object, and 16 are synthesized using the techniques described herein. For each audio clip, the subject is asked to identify among a set of 5 choices (wood, plastic, metal, porcelain, and glass), from which the sound came. A total of 53 subjects (35 women and 18 men), from age of 22 to 71, participated in this study. The 8 real objects are: a wood plate, a plastic plate, a metal plate, a porcelain plate, and four glass bowls with different sizes. The 16 virtual objects are: three different shapes (a plate, a stick, and a bunny) for each of these four materials: wood, plastic, metal, and porcelain, plus four glass bowls with different sizes.

We show the cumulative recognition rates of the sounding materials in two separate matrices: Table III presents the recognition rates of sounds from real-world materials, and Table IV reflects the recognition rates of sounds from synthesized virtual materials. The numbers are normalized with the number of subjects answering the questions. For example, Row 3 of Table III means that for a given real-world sound recorded from hitting a metal object, none of the subjects thought it came from wood or plastic, 66.1% of them thought it came from metal, 9.7% of them thought it came from porcelain and 24.2% of them thought it came from glass. Correspondingly, Row 3 of Table IV shows that for a sound synthesized with our estimated parameters for metal, the percentage of subjects thinking that it came from wood, plastic, metal, porcelain or glass respectively.

We found that the successful recognition rate of virtual materials using our synthesized sounds compares favorably to the recognition rate of real materials using recorded sounds. The difference of the recognition rates (recorded minus synthesized) is close to zero for most of the materials, with 95% confidence intervals shown in Table V. A confidence interval covering zero means that the difference in recognition rate is not statistically significant. If both endpoints of a confidence interval are positive, the recognition rate of the real material is significantly higher than that of the virtual material; if both endpoints are negative, the recognition rate of the real material is significantly lower.

In general, for both recorded and synthesized sounds, several subjects have reported difficulty in reliably differentiating between wooden and dull plastic materials and between glass and porcelain. On the other hand, some of the subjects suggested that we remove redundant audio clips, which are in fact distinct sound clips of recordings generated from hitting real materials and their synthesized counterparts.

TABLE III

Material Recognition Rate Matrix: Recorded Sounds

| | Recognized Material | | | | |
|---|---|---|---|---|---|
| Recorded Material | Wood (%) | Plastic (%) | Metal (%) | Porcelain (%) | Glass (%) |
| Wood | 50.7 | 47.9 | 0.0 | 0.0 | 1.4 |
| Plastic | 37.5 | 37.5 | 6.3 | 0.0 | 18.8 |
| Metal | 0.0 | 0.0 | 66.1 | 9.7 | 24.2 |
| Porcelain | 0.0 | 0.0 | 1.2 | 15.1 | 83.7 |
| Glass | 1.7 | 1.7 | 1.7 | 21.6 | 73.3 |

TABLE IV

Material Recognition Rate Matrix: Synthesized Sounds Using Our Method

| | Recognized Material | | | | |
|---|---|---|---|---|---|
| Synthesized Material | Wood (%) | Plastic (%) | Metal (%) | Porcelain (%) | Glass (%) |
| Wood | 52.8 | 43.5 | 0.0 | 0.0 | 3.7 |
| Plastic | 43.0 | 52.7 | 0.0 | 2.2 | 2.2 |
| Metal | 1.8 | 1.8 | 69.6 | 15.2 | 11.7 |
| Porcelain | 0.0 | 1.1 | 7.4 | 29.8 | 61.7 |
| Glass | 3.3 | 3.3 | 3.8 | 40.4 | 49.2 |

TABLE V

| 95% Confidence Interval of Difference in Recognition Rates | | | | |
|---|---|---|---|---|
| Wood(%) | Plastic(%) | Metal(%) | Porcelain(%) | Glass (%) |
| (−17.1; 12.9) | (−44.7; 14.3) | (−18.2; 11.3) | (−27.7; −1.6) | (12.6; 35.6) |

9. Conclusions and Future Work

The subject matter described herein includes a data-driven, physically-based sound synthesis algorithm using an example audio clip from real-world recordings. By exploiting psychoacoustic principles and feature identification using linear modal analysis, we are able to estimate the appropriate material parameters that capture the intrinsic audio properties of the original materials and transfer them to virtual objects of different sizes, shape, geometry and pair-wise interaction. We also propose an effective residual computation technique to compensate for linear approximation of modal synthesis.

Although our experiments show successful results in estimating the material parameters and computing the residuals, it has some limitations. Our model assumes linear deformation and Rayleigh damping. While offering computational efficiency, these models cannot always capture all sound phenomena that real world materials demonstrate. Therefore, it is practically impossible for the modal synthesis sounds generated with our estimated material parameters to sound exactly the same as the real-world recording. Our feature extraction and parameter estimation depend on the assumption that the modes do not couple with one another. Although it holds for the objects in our experiments, it may fail when recording from objects of other shapes, e.g. thin shells where nonlinear models would be more appropriate [Chadwick et al. 2009].

We also assume that the recorded material is homogeneous and isotropic. For example, wood is highly anisotropic when measured along or across the direction of growth. The anisotropy greatly affects the sound quality and is an important factor in making high-precision musical instruments.

Despite these limitations, our proposed framework is general, allowing future research to further improve and use different individual components. For example, the difference metric now considers the psychoacoustic factors and material resemblance through power spectrogram comparison and feature matching. It is possible that more factors can be taken into account, or a more suitable representation, as well as a different similarity measurement of sounds can be found.

The optimization process approximates the global optimum by searching through all 'good' starting points. With a deeper investigation of the parameter space and more experiments, the performance may be possibly improved by designing a more efficient scheme to navigate the parameter space, such as starting-point clustering, early pruning, or a different optimization procedure can be adopted.

Our residual computation compensates the difference between the real recording and the synthesized sound, and we proposed a method to transfer it to different objects. While our transferring technique is consistent with the other components of the sound (i.e. the modes) and produces plausible results, it is not the only way—much due to the fact that the origin and nature of residual is unknown.

The subject matter described herein includes a system that can quickly estimate the optimal material parameters and compute the residual merely based on a single recording with a non-expensive and simple setup. However, where a small number of recordings of the same material are given as input, machine learning techniques can be used to determine the set of parameters with maximum likelihood, and it could be an area worth exploring. Finally, we would like to extend this framework to other non-rigid objects and fluids, and possibly nonlinear modal synthesis models as well.

In summary, data-driven approaches have proven useful in areas in computer graphics, including rendering, lighting, character animation, and dynamics simulation. With promising results that are transferable to virtual objects of different geometries, sizes, and interactions, this work is the first rigorous treatment of the problem on automatically determining the material parameters for physically-based sound synthesis using a single sound recording, and it offers a new direction for combining example-guided and modal-based approaches.

The disclosure of each of the following references is incorporated herein by reference in its entirety.

REFERENCES

ADMEN, J.-M. 1991. Representations of musical signals. MIT Press, Cambridge, Mass., USA, Chapter The missing link: modal synthesis, 269-298.

AUDIOKINETIC. 2011. Wwise SoundSeed Impact. http://www.audiokinetic.com/en/products/wwise-add-ons/soundseed/introduction.

BESL, P. J. AND MCKAY, N. D. 1992. A method for registration of 3-D shapes. *IEEE Transactions on pattern analysis and machine intelligence*, 239-256.

BONNEEL, N., DRETTAKIS, G., TSINGOS, N., VIALTIO-DELMON, I., AND JAMES, D. 2008. Fast modal sounds with scalable frequency-domain synthesis. *ACM Transactions on Graphics (TOG)* 27, 3, 24.

CHADWICK, J. N., AN, S. S., AND JAMES, D. L. 2009. Harmonic shells: a practical nonlinear sound model for near-rigid thin shells. In *SIGGRAPH Asia '09: ACM SIGGRAPH Asia 2009 papers*. ACM, New York, N.Y., USA, 1-10.

CHADWICK, J. N. AND JAMES, D. L. 2011. Animating fire with sound. In *ACM Transactions on Graphics (TOG)*. Vol. 30. ACM, 84.

COOK, P. R. 1996. Physically informed sonic modeling (PhISM): percussive synthesis. In *Proceedings of the 1996 International Computer Music Conference*. The International Computer Music Association, 228-231.

COOK, P. R. 1997. Physically informed sonic modeling (phism): Synthesis of percussive sounds. *Computer Music Journal* 21, 3, 38-49.

COOK, P. R. 2002. *Real Sound Synthesis fbr Interactive Applications*. A. K. Peters, Ltd., Natick, Mass., USA.

CORBETT, R., VAN DEN DOEL, K., LLOYD, J. E., AND HEIDRICH, W. 2007. Timbrefields: 3d interactive sound models for real-time audio. *Presence: Teleoperators and Virtual Environments* 16, 6, 643-654.

DOBASHI, Y., YAMAMOTO, T., AND NISFIITA, T. 2003. Real-time rendering of aerodynamic sound using sound textures based on computational fluid dynamics. *ACM Trans. Graph.* 22, 3, 732-740.

DOBASHI, Y., YAMAMOTO, T., AND NISHITA, T. 2004. Synthesizing sound from turbulent field using sound textures for interactive fluid simulation. In *Computer Graphics Forum*. Vol. 23. Wiley Online Library, 539-545.

DUBUISSON, M. P. AND JAIN, A. K. 1994. A modified hausdorff distance for object matching. In *Proceedings of 1202 International Conference on Pattern. Recognition*. Vol. 1. IEEE Comput. Soc. Press, 566-568.

FONTANA, F. 2003. *The sounding object*. Mondo Estremo.

GOPE, C. AND KEHTARNAVAZ, N. 2007. Affine invariant comparison of point-sets using convex hulls and hausdorff distances. *Pattern recognition* 40, 1,309-320.

GRIFFIN, D. AND LIM, J. 2003. Signal estimation from modified short-time Fourier transform. *Acoustics, Speech and Signal Processing, IEEE Transactions on* 32, 2,236-243.

ISO. 2003. ISO 226: 2003: *Acoustics Normal equal loudness-level contours*. International Organization for Standardization.

JAMES, D., BARBIG, J., AND PAT, D. 2006. Precomputed acoustic transfer: output-sensitive, accurate sound generation for geometrically complex vibration sources. In *ACM SIGGRAPH 2006 Papers*. ACM, 995.

KLATZKY, R. L., PAI, D. K., AND KROTKOV, E. P. 2000. Perception of material from contact sounds. *Presence: Teleoper Virtual Environ.* 9, 399-410.

KROTKOV, E., KLATZKY, R., AND ZUMEL, N. 1996. Analysis and synthesis of the sounds of impact based on shape-invariant properties of materials. In *Proceedings of the 1996 International Conference on Pattern Recognition (ICPR '96) Volume I-Volume 7270*. ICPR '96 IEEE Computer Society, Washington, D.C., USA, 115-.

LAGARIAS, J. C., REEDS, J. A., WRIGHT, M. H., AND WRIGHT, P. E. 1999. Convergence properties of the Nelder-Mead simplex method in low dimensions. *SIAM Journal on Optimization* 9, 1,112-147.

LAKATOS, S., MOADAMS, S., AND CAUSSE, R. 1997. The representation of auditory source characteristics: Simple geometric form. *Attention, Perception, & Psychophysics* 59, 8, 1180-1190.

LEVINE, S. N VERMA, T. S., AND SMITH, J. O. 1998. Multiresolution sinusoidal modeling for wideband audio with modifications. In *Acoustics, Speech and Signal Processing, 1998. Proceedings of the 1998 IEEE International Conference on*. Vol. 6. IEEE, 3585-3588 vol. 6.

LLOYD, D. B., RAGHUVANSHI, N., AND GOVINDARAJU, N. K. 2011. Sound Synthesis for Impact Sounds in Video Games. In *Proceedings of Symposium on Interactive 3D Graphics and Games.*

MORCHEN, F., ULTSCH, A., THIES, M., AND LOHKEN, I. 2006. Modeling timbre distance with temporal statistics from polyphonic music. *Audio. Speech, and Language Processing, IEEE Transactions on* 14, 1 (January), 81-90.

Moss, W., YEH, H., HONG, J., LIN, M., AND MANOCHA, D. 2010. Sounding Liquids: Automatic Sound Synthesis from Fluid Simulation. *ACM Transactions on Graphics (TOG).*

O'BRIEN, J. F., COOK, P. R., AND ESSL, G. 2001. Synthesizing sounds from physically based motion. In *Proceedings of ACM SIGGRAPH 2001*. ACM Press, 529-536.

O'BRIEN, J. F., SHEN, C., AND GATCHALIAN, C. M. 2002. Synthesizing sounds from rigid-body simulations. In *The ACM SIGGRAPH 2002 Symposium on Computer Animation*. ACM Press, 175-181.

OPPENHEIM, A. V., SCHAFER, R. W., AND BUCK, J. R. 1989. *Discrete-time signal processing*. Vol. 1999. Prentice hall Englewood Cliffs, N.J.

PAT, D. K., DOF.L., K. V. D., JAMES, D. L., LANG, J., LLOYD, J. E., RICHMOND, J. L., AND YAU, S. H. 2001. Scanning physical interaction behavior of 3d objects. In *Proceedings of the 28th annual conference on Computer graphics and interactive techniques*. SIGGRAPH '01. ACM, New York, N.Y., USA, 87-96.

PAMPALK, E., RAUBER, A., AND MERKL, D. 2002. Content-based organization and visualization of music archives. In *Proceedings of the tenth ACM international conference on Multimedia*. ACM, 570-579.

PICARD, C., TSINGOS, N., AND FAURE, F. 2009. Retargetting example sounds to interactive physics-driven animations. In *AES 35th International Conference-Audio for Gaines, London, UK.*

QUATIERI, T. AND McAHLAY, R. 1985. Speech transformations based on a sinusoidal representation. In *Acoustics, Speech, and Signal Processing, IEEE International Conference on ICASSP '85*. Vol. 10. 489-492.

RAGHUVANSHI, N. AND LIN, M. 2006. Symphony: Real-time physically-based sound synthesis. In *Proceedings of Symposium on Interactive 3D Graphics and Games.*

REN, Z., YEII, H., AND LIN, M. 2010. Synthesizing contact sounds between textured models. In *Virtual Reality Conference (VR), 2010 IEEE*. 139-146.

ROADS, C. 2004. *Microsound*. The MIT Press.

SERRA, X. 1989. A system for sound Analysis/Transformation/Synthesis based on a deterministic plus stochastic decomposition. Ph.D. thesis.

SERRA, X. 1997. Musical sound modeling with sinusoids plus noise. *Musical signal processing,* 497-510.

SERRA, X. AND SMITH III, J. 1990. Spectral modeling synthesis: A sound analysis/synthesis system based on a deterministic plus stochastic decomposition. *Computer Music Journal* 14, 4, 12-24.

SHABANA, A. 1997. *Vibration of discrete and continuous systems*. Springer Verlag.

STEIGLITZ, K. AND McBRIDE, L. 1965. A technique for the identification of linear systems. *Automatic Contml, IEEE Transactions on* 10, 4, 461-464.

TREBIEN, F. AND OLIVEIRA, M. 2009. Realistic real-time sound resynthesis and processing for interactive virtual worlds. *The Visual Computer* 25, 469-477.

VALIMAKI, V., HUOPANIEMI, J., KARIALAINEN, M., AND JANOSY, Z. 1996. Physical modeling of plucked string instruments with application to real-time sound synthesis. *Journal of the Audio Engineering Society* 44, 5, 331-353.

VALIMAKI, V. AND TOLONEN, T. 1997. Development and calibration of a guitar synthesizer. *PREPRINTS-AUDIO ENGINEERING SOCIETY*. VAN DEN DOEL, K., KNOTT, D., AND PAI, D. K. 2004. Interactive simulation of complex audiovisual scenes. *Presence: Teleoper Virtual EnViron.* 13, 99-111.

VAN DEN DOEL, K., KRY, P., AND PAT, D. 2001. Foley Automatic: physically-based sound effects for interactive simulation and animation. In *Proceedings of the 28th annual conference on Computer graphics and interactive techniques*. ACM New York, N.Y., USA, 537-544.

VAN DEN DOEL, K. AND PAT, D. K. 1998. The sounds of physical shapes. *Presence: Teleoper. Virtual Envimn.* 7, 382-395.

VAN DEN DOEL, K. AND PAT, D. K. 2002. Measurements of perceptual quality of contact sound models. In *In Proceedings of the International Conference on Auditory Display (ICAD* 2002. 345-349.

WANG, S., SEKEY, A., AND GERSHO, A. 1992. An objective measure for predicting subjective quality of speech coders. *IEEE Journal on Selected Areas in Communications* 10, 5 (June), 819-829.

WILDES, R. AND RICHARDS, W. 1988. Recovering material properties from sound. *Natural computation,* 356-363.

ZHENG, C. AND JAMES, D. L. 2009. Harmonic fluids. *In SIGGRAPH '09: ACM SIGGRAPH 2009 papers*. ACM, New York, N.Y., USA, 1-12. ZHENG, C. AND JAMES, D.

L. 2010. Rigid-body fracture sound with precomputed soundbanks. *ACM Trans. Graph.* 29, 69:1-69:13.

ZHENG, C. AND JAMES, D. L. 2011. Toward high-quality modal contact sound. *ACM Transactions on Graphics (Proceedings of SIGGRAPH* 2011) 30, 4 (August).

ZWICKER, E. AND FASTL, H. 1999. Psychoacoustics: Facts and models, 2nd updated edition ed. Vol. 254. Springer New York,

APPENDIX

A. Transferability of Rayleigh Damping Parameters

The concept of internal friction describes the relationship between frequency and damping for an object and is regarded as a shape-invariant property [Klatzky et al. 2000; Krotkov et al. 1996; Wildes and Richards 1988]. People have used empirical data to model this frequency-damping relationship. Some work fits a constant angle of friction model to the measured data, while some fits a quadratic curve. Rayleigh damping is among one of the known empirical models that model the frequency-damping relationship with a special class of curve and can be considered a specific type of internal friction.

Figure 15:
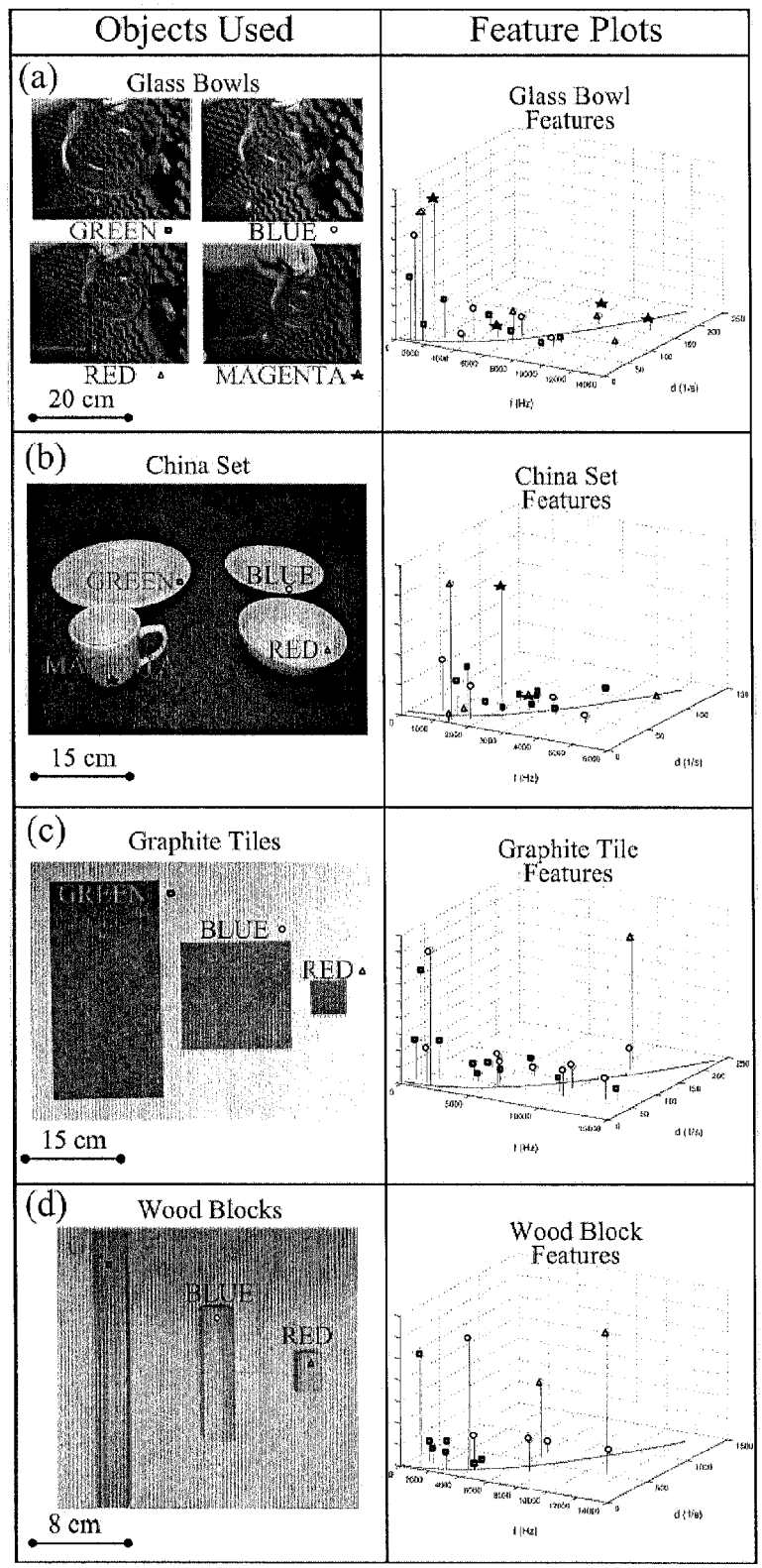
FIG. 15 illustrates results from an experiment to see if Rayleigh damping parameters for the same material can be considered geometry independent.

In order to reexamine the applicability of the Rayleigh damping empirical model in its transferability across different geometry and shapes, we performed some experiments to verify if the Rayleigh damping parameters can be considered shape-invariant. We recorded impact audio for real objects of various shapes for four materials. Then the resonance modes of those objects were extracted with our feature extraction algorithm. If the modes of different objects for the same material all fall on one Rayleigh damping curve, we believe it is reasonable to assume that the Rayleigh damping parameters can indeed be transferred across different shapes. The results of our experiments are shown in FIG. 15. The real objects used in this experiment are pictured in the left column, i.e. (a) glass bowls, (b) china set, (c) graphite tiles, and (d) wooden blocks. In the right column, i.e. feature plots, the objects' resonance modes are visualized as lines topped with geometric shapes in the frequency-damping space, and the height of each line indicates the modes' relative energy. We show the most prominent modes, i.e. modes with highest energy levels. Different objects' resonance modes are color coded differently. For example in (a), the largest glass bowl is coded 'GREEN', and its resonances modes are shown as the green lines in that material's feature plot. However, because color drawings are not permitted in PCT patent applications, each color is mapped to a geometric shape. The left hand column illustrates the mappings between colors and shapes: green corresponds to a square, blue corresponds to a circle, red corresponds to a triangle, and magenta corresponds to a star. The black curve shown on the frequency-damping plane in each feature plot is determined by one set of Rayleigh damping parameters. For various shaped objects with the same material, their resonance modes appear to lie closely to the same black curve. This indicates the same Rayleigh damping parameters can be used to describe the frequency-damping relationship for all those different geometries with the same material.

Furthermore, our user study results provide validation on the assumptions we made about Raleigh-damping model, offering insights consistent with our core hypothesis. We played synthesized sounds with our estimated material parameters applied to various shapes (plate, bunny, stick, and bowl), and the material detection rate for each individual shape does not vary much from one another. For example, the material detection rate for the metallic bunny is almost the same as that for the metallic plate. Our perceptual studies indicate that it is feasible to transfer Rayleigh damping parameters across different shapes and geometry for sound synthesis applications.

B. Comparison with Previous Feature Extraction Methods

B.1 Comparison with SMS

The Spectral Modeling Synthesis (SMS) method [Serra and Smith III 1990] detects a peak also in the power spectrogram, tracks the one peak point over time, and forms an amplitude envelope. One can certainly use this amplitude envelope to infer the damping value, for example, by linear regression of the logarithmic amplitude values (which is the approach adopted by Välimäki et al. [1996]). There are, however, several disadvantages of this approach.

First of all, tracking only the peak point over time implies that the frequency estimation is only accurate to the width of the frequency bins of power spectrogram. For example, for a window size of 512 samples, the width of a frequency bin is about 86 Hz, direct frequency peak tracking has frequency resolution as coarse as 86 Hz.

Figure 16:
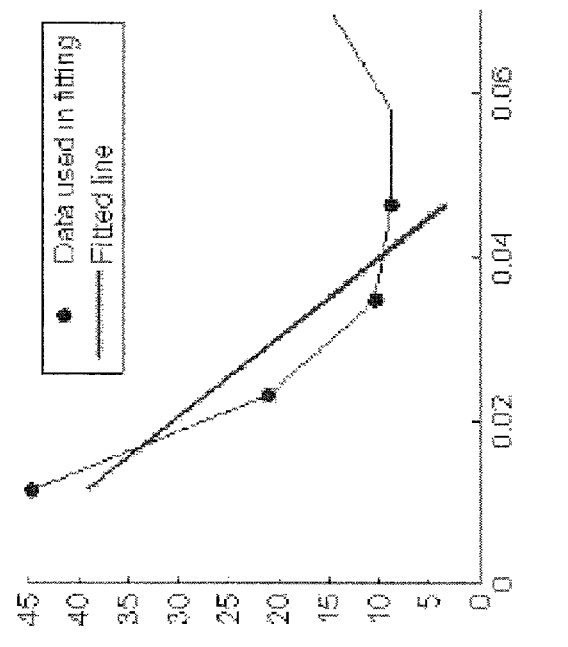
FIG. 16 illustrates estimation of damping value in the presence of noise, using (a) our local shape fitting method and (b) SMS with linear regression.
Figure 16:
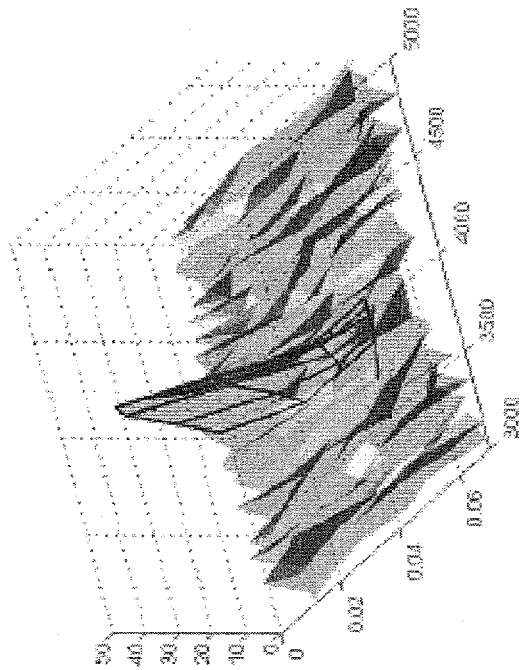

Serra and Smith pointed out this problem [Serra and Smith III 1990], and proposes to improve the accuracy by taking the two neighboring frequency bins around the peak and performing a 3-point curve fitting to find the real peak [Serra 1989]. Our method takes a further step: instead of 3 points per time frame, we use all points within a rectangular region. The region extends as far as possible in both frequency and time axes until (a) the amplitude falls under a threshold to the peak amplitude, or (b) a local minimum in amplitude is reached. We then use an optimizer to find a damped sinusoid whose power spectrogram best matches the shape of the input data in the region of interest. An example is shown in FIG. 16(*a*), where the solid surface is the power spectrogram of the input sound clip, and the overlay mesh is the power spectrogram of the best fitted damped sinusoid.

Secondly, for linear regression to work well, there must be at least two points (the more the better) along the time axis, before the signal falls to the level of background noise. For high damping values, there will be only a few data points along the time axis. On the other hand, we know that the damping value is also reflected in the width of the hill, so when there are not enough points along the time axis, there are more points along the frequency axis with significant heights-which will help determining the damping value in our surface fitting method.

Figure 17:
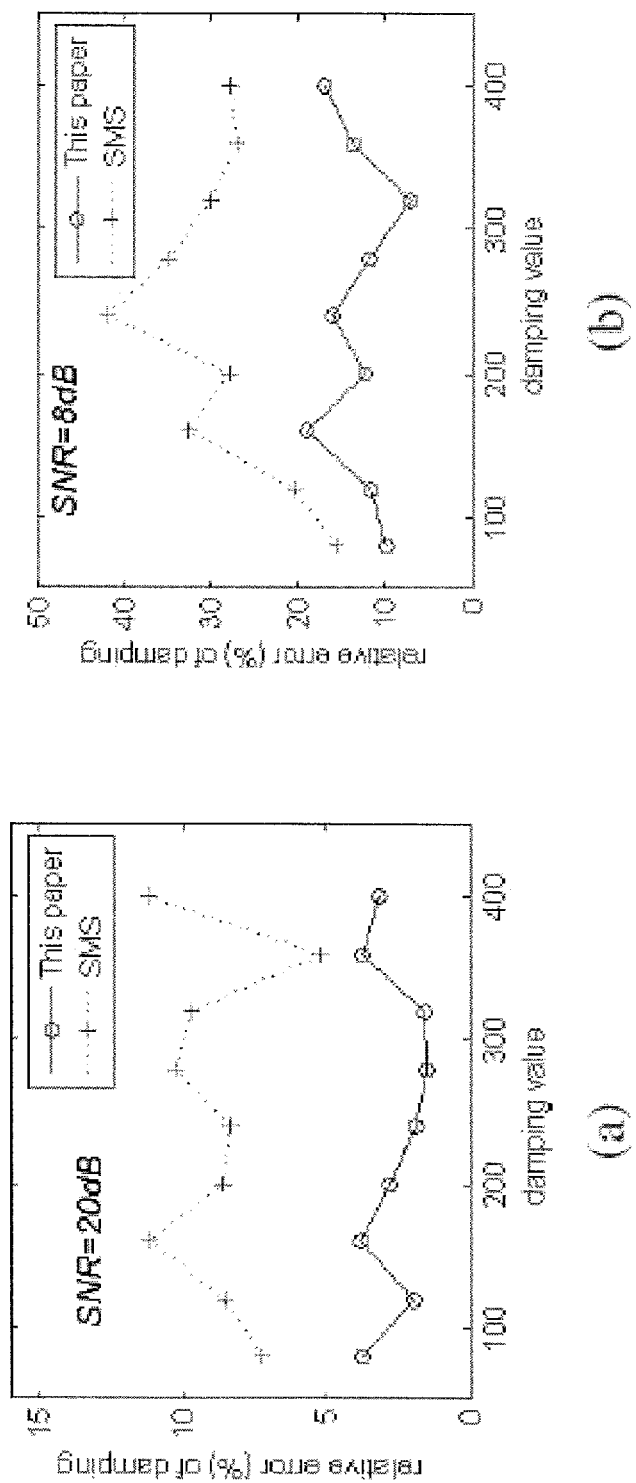
FIG. 17 illustrates average damping error versus damping value for our method and SMS.

Taking more points into account makes it less sensitive to noise. In FIG. 17, we simulated a noisy case where white noise with signal-to-noise ratio (SNR)=8 dB is added to a damped sinusoid with damping value 240, and use (a) our local surface fitting method and (b) SMS with linear regression to infer the damping value. In this particular example, due to the high damping value and high noise level, only 4 points participate in linear regression, while 24 points are considered in our method. Our shape fitting is less sensitive to irregularities than the fitted line in SMS. The average damping error versus damping value for both methods are plotted in FIG. 17*a* and FIG. 17*b*, where SNR=20 dB and 8 dB respectively.

Mathematically, the 2D power spectrogram contains as much information as the original time domain signal (except for the windowing effect and the loss of phase). Using only a 1D sequence inevitably discards a portion of all available information (as in SMS), and in some cases (e.g. high damping values and high noise level) this portion is significant. Our surface matching method utilizes as much information as possible. Fitting a surface is indeed more costly than fitting a line, but it also achieves higher accuracy.

B.2 Comparison with a Phase Unwrapping Method

The 'phase unwrapping' technique proposed by Pai et al. [2001] and Corbett et al. [2007] is known for its ability to separate close modes within one frequency bin. Our method, however, works under a different assumption, and the ability to separate modes within a frequency bin has different impacts in our framework and theirs. In their framework, the extracted features $\{f_i, d_i, a_i\}$ are directly used in the sound synthesis stage and thus control the final audio quality. In our case, the features are only used to guide the subsequent parameter estimation process. In this process, two close modes will show up as near-duplicate points in the (f,d)-space. Because as pointed out by Pai et al. [2001], modes with close frequencies usually result from the shape symmetry of the sounding object, and their damping values should also be close. In the process of fitting material parameters, or more specifically, in computing the feature domain metric, replacing these near-duplicate points with one point does not affect the quality of the result much.

Secondly, despite of its ability to separate nearby modes, Corbett et al. [2007] also proposes to merge modes if their difference in frequency is not greater than human's audible frequency discrimination limit (2-4 Hz). Among the multiple levels of power spectrograms that we used, the finest frequency resolution (about 3 Hz) is in fact around this limit.

Figure 18:
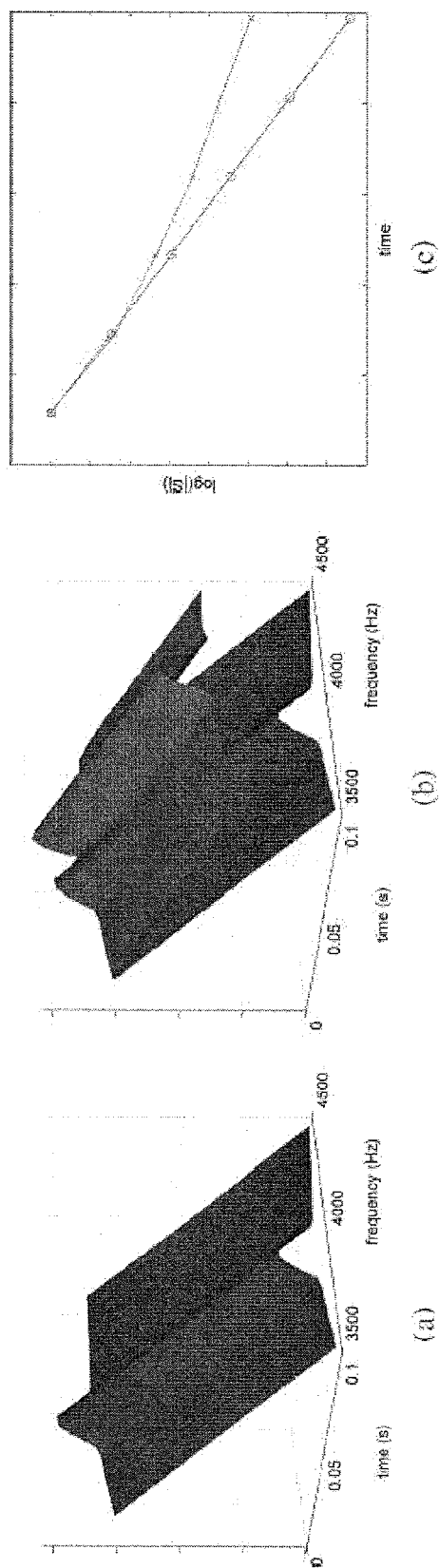
FIG. 18 illustrates interference from a neighboring mode located several bins away.

On the other hand, our proposed feature extraction algorithm offers some advantages and achieves higher accuracy compared with Pai et al. [2001] and Corbett et al. [2007] in some cases. When extracting the information of a mode, other modes within the same frequency bin (which are successfully resolved by the Steiglitz-McBride algorithm [Steiglitz and McBride 1965] underlying Pai et al. [2001] and Corbett et al. [2007]) are not the only source of interference. Other modes from several bins away also affect the values (complex or magnitude-only alike) in the current bin, known as the 'spillover effect'. In order to minimize this effect, the greedy method proposed herein collects the modes with the largest average power spectral density first. Therefore, when examining a mode, the neighboring modes that have higher energy than the current one are already collected, and their influence removed. This can be demonstrated in FIG. 18. The original power spectrogram of a mode $(f_1, d_1, a_1)$ is shown in FIG. 18(a). The values at the frequency bin $F_k$ containing $f_1$ are plotted over time, shown as the curve connecting the circles in FIG. 18(c). In FIG. 18(b), the presence of another strong mode $(f_2, d_2, a_2)$ located 5 bins away changes the values at $F_k$, plotted as the curve connecting the x's in FIG. 18(c). The complex values of the STFT at $F_k$ are not shown, but they are similarly interfered. If these complex values at $F_k$ are directly fitted with the Steiglitz-McBride algorithm in the works by Pai et al. [2001] and Corbett et al. [2007], the estimated damping has a 20% error. The greedy approach in our multi-level algorithm removes the influence of the neighboring, mode first, resulting in a 1% damping error.

Figure 19:
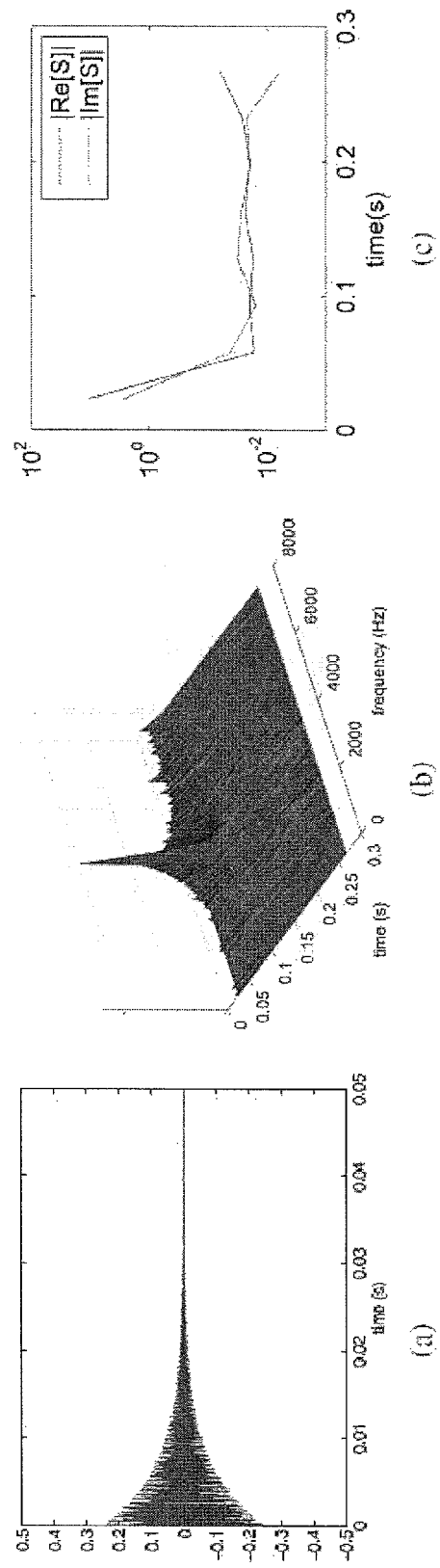
FIG. 19 illustrates a noisy, high damping experiment.

Based on our experimentations, we also found that the universal frequency-time resolution used in Pai et al. [2001] and Corbett et al. [2007] is not always most suitable for all modes. Our method uses a dynamic selection of frequency-time resolution to address this problem. For example, in the case of high damping values, under a fixed frequency-time resolution, there may only be a few points above noise level along the time axis, which will undermine the accuracy of the Steiglitz-McBride algorithm. FIG. 19 shows such an example, the damping value (150 s$^{-1}$) is high but not unreasonable, as shown in the time domain signal FIG. 19a, where a white noise with SNR=60 dB is added. The power spectrogram is shown in FIG. 19b. We implemented the method in the paper by Corbett et al. [2007] using the suggested 46 ms window size (with $N_{overlap}$=4) and tested on the above case. The input to this method is the complex values at the peak frequency bin, whose magnitudes of the real and imaginary parts are shown in FIG. 19c, and an error of 5.7% for damping is obtained. As a comparison, our algorithm automatically selects a 23 ms window size and fits the local shape in a 6×5 region in the frequency-time space, yielding merely a 0.9% error for damping.

C. Constants and Functions

We provide here the actual values and forms used in our implementation for the constants and functions introduced in Sec. 5.2, For the relationship between critical-band rate z (in Bark) and frequency (in Hz), we use $$Z(f) = 6 \sin h^{-1}(f/600) \quad (30)$$

that approximates the empirically determined curve shown in FIG. 4(a) [Wang et al. 1992].

We use $c_z$=5.0 and $c_d$=100.0 in Eqn. 21 and Eqn. 22.

In Eqn. 23, the weight $w_i$ associated to a reference feature point $\phi_i$ is designed to be related to the energy of mode i. The energy can be found by integrating the power spectrogram of the damped sinusoid, and we made a modification such that the power spectrogram is transformed prior to integration. The image domain transformation introduced in Sec. 5.2.1, which better reflects the perceptual importance of a feature, is used.

The weight $\tilde{u}_{ij}$ used in Eqn. 24 is $\tilde{u}_{ij}$=0 for $k(\phi_i, \tilde{\phi}_j)$=0, and $\tilde{u}_{ij}$=1 for $k(\phi_i, \tilde{\phi}_j)$>0 ($u_{ij}$ is defined similarly).

For the point-to-point match score $k(\phi_i, \tilde{\phi}_j)$ in Eqn. 24, we use $$k(\phi_i, \tilde{\phi}_j) = k(D) \quad (31)$$
$$= \begin{cases} 1.0 - 0.5D & \text{if } D \leq 1.0 \\ 0.5/D & \text{if } 1.0 < D \leq 5.0 \\ 0 & \text{if } 5.0 < D \end{cases}$$

where D=D($\phi_i, \tilde{\phi}_j$) is the Euclidean distance between the two feature points (Eqn. 20).

The subject matter described herein for sound synthesis using estimated material parameters can be used for a variety of applications, including video games and virtual reality applications. The example guided sound synthesis techniques described herein may also be used to estimate intrinsic parameters for liquid sound simulation or voice recognition and retargeting.

It will be understood that various details of the subject matter described herein may be changed without departing from the scope of the subject matter described herein. Furthermore, the foregoing description is for the purpose of illustration only, and not for the purpose of limitation.

What is claimed is:

1. A method for sound synthesis using estimated material parameters, the method comprising:
    at a computing platform including a memory and a processor:
        estimating, by the processor and based on a recorded audio sample of an impact on a physical object, one or more material parameters of the physical object for use in synthesizing a sound associated with a virtual object having material properties similar to the physical object;

storing the one or more material parameters in the memory; and using the estimated material parameters to generate a synthesized sound for the virtual object.

2. The method of claim 1 wherein estimating the one or more material parameters of the physical object includes extracting a set of damped sinusoids from the recorded audio sample.

3. The method of claim 2 wherein extracting the set of damped sinusoids comprises:

computing a set of multi-level power spectrograms for the recorded audio sample;

identifying potential modes by searching through each level of the multi-level power spectrograms for local maxima; and for each potential mode, estimating a frequency and damping value by performing a local shape fitting around the local maximum.

4. The method of claim 3 wherein performing the local shape fitting around the local maximum comprises:

synthesizing a damped sinusoid having a frequency, damping, and initial amplitude;

adding the synthesized damped sinusoid to an aggregate sound clip comprising previously synthesized damped sinusoids for the potential mode;

computing a power spectrogram for the aggregate sound clip;

computing a shape fitting error for the synthesized damped sinusoid by comparing the computed power spectrogram for the aggregate sound clip to its corresponding power spectrogram for the recorded audio sample;

determining whether the shape fitting error is below a predefined threshold; and in response to determining that the shape fitting error is below the predefined threshold, storing at least one of the frequency, damping, and initial amplitude of the synthesized damped sinusoid as a feature value for the potential mode.

5. The method of claim 1 wherein estimating the one or more material parameters comprises:

generating an estimated sound and feature set associated with a reference virtual object corresponding to the physical object;

calculating a difference metric by comparing the estimated sound and feature set to the recorded audio sample and its corresponding features; and estimating the one or more material parameters by solving for material parameters which minimize the difference metric.

6. The method of claim 5 wherein generating the estimated sound and feature set associated with the reference virtual object comprises:

determining an excitation pattern of eigenvalues for the reference virtual object by applying an impulse on the reference virtual object at a point corresponding to an actual impact point on the physical object used in producing the recorded audio sample;

generating, based on the excitation pattern, a mapping from assumed eigenvalues and their excitations to estimated modes; and generating the estimated sound by mixing the estimated modes.

7. The method of claim 5 wherein the difference metric comprises: a metric corresponding to perceptual similarity of the estimated sound and the recorded audio sample; and a metric corresponding to audio material resemblance of the reference virtual object and the physical object.

8. A method for simulating sound associated with a virtual object, the method comprising:

at a computing platform comprising a processor and a memory:

retrieving, from the memory, one or more material parameters associated with a virtual object, wherein the material parameters comprise at least one material parameter estimated based on a recorded audio sample of an impact on a physical object having material properties similar to the virtual object; and utilizing the retrieved material parameters to synthesize a sound associated with the virtual object.

9. The method of claim 8 wherein the material parameters comprise at least one of a stiffness associated with the physical object, a damping coefficient associated with the physical object, and a mass density associated with the physical object.

10. The method of claim 8 wherein the at least one material parameter is estimated based on a set of damped sinusoids extracted from the recorded audio sample.

11. The method of claim 10 wherein utilizing the retrieved material parameters to synthesize a sound associated with the virtual object comprises augmenting the sound to account for residual differences between the set of damped sinusoids and the recorded audio sample.

12. The method of claim 11 wherein the residual differences between the set of damped sinusoids and the recorded audio sample are determined by computing a represented sound that corresponds to a portion of the recorded audio sample represented by the set of damped sinusoids and subtracting a power spectrogram of the represented sound from a power spectrogram of the recorded audio sample.

13. The method of claim 12 wherein computing the represented sound comprises:

for each of a plurality of reference features associated with the virtual object:

calculating a ratio that corresponds to how accurately the reference feature is represented by the set of damped sinusoids; and subtracting a portion of the power spectrum of the represented sound corresponding to the reference feature from a portion of the power spectrogram of the recorded audio sample corresponding to the reference feature, wherein the portion of the power spectrum of the represented sound corresponding to the reference feature subtracted from the portion of the power spectrogram of the recorded audio sample corresponding to the reference feature is weighted by the calculated ratio.

14. The method of claim 11 wherein the virtual object differs in geometry from a reference virtual object used to generate the set of damped sinusoids and wherein utilizing the retrieved material parameters to synthesize a sound associated with the virtual object comprises:

generating a transform function for transforming a power spectrogram based on the set of damped sinusoids to a power spectrogram that accounts for the differing geometry; and applying the transform function to a power spectrogram of the residual differences.

15. A system for sound synthesis using estimated material parameters, the system comprising:

a computing platform comprising a memory and a processor;

a material parameter estimation module embodied in the memory and configured to cause the processor to estimate, based on a recorded audio sample of an impact on a physical object, one or more material parameters of the physical object for use in synthesizing a sound associated with a virtual object having material properties similar to the physical object; and a synthesizer module embodied in the memory and configured to cause the processor to use the estimated material parameters to generate a synthesized sound for the virtual object.

16. The system of claim 15 wherein the material parameter estimation module is configured to extract a set of damped sinusoids from the recorded audio sample.

17. The system of claim 16 wherein the material parameter estimation module is configured to:

compute a set of multi-level power spectrograms for the recorded audio sample;

identify potential modes by searching through each level of the multi-level power spectrograms for local maxima; and for each potential mode, estimate a frequency and damping value by performing a local shape fitting around the local maximum.

18. The system of claim 17 wherein the material parameter estimation module is configured to perform the local shape fitting around the local maximum by:

synthesizing a damped sinusoid having a frequency, damping, and initial amplitude;

adding the synthesized damped sinusoid to an aggregate sound clip comprising previously synthesized damped sinusoids for the potential mode;

computing a power spectrogram for the aggregate sound clip;

computing a shape fitting error for the synthesized damped sinusoid by comparing the computed power spectrogram for the aggregate sound clip to its corresponding power spectrogram for the recorded audio sample;

determining whether the shape fitting error is below a predefined threshold; and in response to determining that the shape fitting error is below the predefined threshold, storing at least one of the frequency, damping, and initial amplitude of the synthesized damped sinusoid as a feature value for the potential mode.

19. The system of claim 15 wherein the material parameter estimation module is configured to:

generate an estimated sound and feature set associated with a reference virtual object corresponding to the physical object;

calculate a difference metric by comparing the estimated sound and feature set to the recorded audio sample and its corresponding features; and estimate the one or more material parameters by solving for material parameters which minimize the difference metric.

20. The system of claim 19 wherein the material parameter estimation module is configured to generate the estimated sound and feature set associated with the reference virtual object by:

determining an excitation pattern of eigenvalues for the reference virtual object by applying an impulse on the reference virtual object at a point corresponding to an actual impact point on the physical object used in producing the recorded audio sample;

generating, based on the excitation pattern, a mapping from assumed eigenvalues and their excitations to estimated modes; and generating the estimated sound by mixing the estimated modes.

21. The system of claim 20 wherein the difference metric comprises: a metric corresponding to perceptual similarity of the estimated sound and the recorded audio sample; and a metric corresponding to audio material resemblance of the reference virtual object and the physical object.

22. A system for simulating sound associated with a virtual object, the system comprising:

a computing platform comprising a memory and a processor; and a synthesizer module embodied in the memory and configured to cause the processor to:

retrieve one or more material parameters associated with a virtual object, wherein the material parameters comprise at least one material parameter estimated based on a recorded audio sample of an impact on a physical object having material properties similar to the virtual object; and utilize the retrieved material parameters to synthesize a sound associated with the virtual object.

23. The system of claim 22 wherein the material parameters comprise at least one of a stiffness associated with the physical object, a damping coefficient associated with the physical object, and a mass density associated with the physical object.

24. The system of claim 22 wherein the at least one material parameter is estimated based on a set of damped sinusoids extracted from the recorded audio sample.

25. The system of claim 24 wherein the synthesizer module is configured to augment the sound to account for residual differences between the set of damped sinusoids and the recorded audio sample.

26. The system of claim 25 wherein the synthesizer module is configured to determine the residual differences between the set of damped sinusoids and the recorded audio sample by computing a represented sound that corresponds to a portion of the recorded audio sample represented by the set of damped sinusoids and subtracting a power spectrogram of the represented sound from a power spectrogram of the recorded audio sample.

27. The system of claim 26 wherein computing the represented sound comprises:

for each of a plurality of reference features associated with the virtual object:

calculating a ratio that corresponds to how accurately the reference feature is represented by the set of damped sinusoids; and subtracting a portion of the power spectrum of the represented sound corresponding to the reference feature from a portion of the power spectrogram of the recorded audio sample corresponding to the reference feature, wherein the portion of the power spectrum of the represented sound corresponding to the reference feature subtracted from the portion of the power spectrogram of the recorded audio sample corresponding to the reference feature is weighted by the calculated ratio.

28. The system of claim 25 wherein the virtual object differs in geometry from a reference virtual object used to generate the set of damped sinusoids and wherein the synthesizer module is configured to:

generate a transform function for transforming a power spectrogram based on the set of damped sinusoids to a power spectrogram that accounts for the differing geometry; and apply the transform function to a power spectrogram of the residual differences.

29. A non-transitory computer readable medium comprising computer executable instructions that when executed by a processor of a computer control the computer to perform steps comprising:

estimating, based on a recorded audio sample of an impact on a physical object, one or more material parameters of the physical object for use in synthesizing a sound associated with a virtual object having material properties similar to the physical object;

storing the one or more material parameters in a memory; and using the estimated material parameters to generate a synthesized sound for the virtual object.

30. A non-transitory computer readable medium comprising computer executable instructions that when executed by a processor of a computer control the computer to perform steps comprising:

retrieving one or more material parameters associated with a virtual object, wherein the material parameters comprise at least one material parameter estimated based on a recorded audio sample of an impact on a physical object having material properties similar to the virtual object; and utilizing the retrieved material parameters to synthesize a sound associated with the virtual object.

* * * * *